(12) United States Patent
Yang et al.

(10) Patent No.: US 10,147,753 B2
(45) Date of Patent: Dec. 4, 2018

(54) STACKED IMAGE SENSOR HAVING AN AIR GAP

(71) Applicant: SK hynix Inc., Gyeonggi-do (KR)

(72) Inventors: Yun-Hui Yang, Chungcheongbuk-do (KR); Seon-Man Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/464,631

(22) Filed: Mar. 21, 2017

(65) Prior Publication Data

US 2018/0069037 A1    Mar. 8, 2018

(30) Foreign Application Priority Data

Sep. 7, 2016    (KR) .................... 10-2016-0114864

(51) Int. Cl.
*H01L 27/146*    (2006.01)
(52) U.S. Cl.
CPC .... *H01L 27/1463* (2013.01); *H01L 27/14612* (2013.01); *H01L 27/14643* (2013.01)

(58) Field of Classification Search
CPC ......... H01L 27/14634; H01L 27/14643; H01L 27/1469; H01L 23/437; H01L 31/024; H01L 31/0521
See application file for complete search history.

(56) References Cited

U.S. PATENT DOCUMENTS

| | | |
|---|---|---|
| 6,759,714 B2 | 7/2004 | Kim et al. |
| 8,487,351 B2 | 7/2013 | Lee et al. |
| 2013/0105667 A1* | 5/2013 | Kobayashi ........ H01L 27/14634 250/208.1 |

* cited by examiner

*Primary Examiner* — Kenneth Parker
*Assistant Examiner* — John Lin
(74) *Attorney, Agent, or Firm* — IP & T Group LLP

(57) ABSTRACT

A stacked image sensor includes: a lower device including a lower inter-layer dielectric layer over an upper surface of a lower substrate, and a lower capping layer over the lower inter-layer dielectric layer; an upper device stacked over the lower device, including photodiodes in an upper substrate, an upper inter-layer dielectric layer below a lower surface of the upper substrate, and an upper capping layer below the upper inter-layer dielectric layer; and an air gap formed between the lower inter-layer dielectric layer and the upper inter-layer dielectric layer.

19 Claims, 31 Drawing Sheets

STACKED IMAGE SENSOR HAVING AN AIR GAP

CROSS-REFERENCE TO RELATED APPLICATIONS

The present application claims priority of Korean Patent Application No. 10-2016-0114864, filed on Sep. 7, 2016, which is incorporated herein by reference in its entirety.

BACKGROUND

1. Field

Exemplary embodiments of the inventive concepts provide a stacked image sensor having an air gap.

2. Description of the Related Art

An image sensor is a device that converts an optical image into electrical signals. Recent advancement in the computer industry and the communication industry calls for increased demands for high-performance stack-type image sensors in diverse fields, such as digital cameras, camcorders, Personal Communication Systems (PCS), game players, security cameras, medical micro cameras, robots and so forth.

A stacked image sensor may include a pixel device and a logic device. The pixel device may include a plurality of photodiodes, a plurality of color filters, and a plurality of micro lenses. The logic device may include a logic circuit for processing electrical signals that are transferred from the pixel device, and an input/output circuit.

The logic device of the stacked image sensor may generate much heat. The heat generated in the logic device may be transmitted to the pixel device to cause such flaws as dark current, white spots, or dark shading and increase resistance of lines.

SUMMARY

Embodiments of the inventive concepts are directed to a stacked image sensor having a heat-shutting structure.

Embodiments of the inventive concepts are directed to a method for fabricating a stacked image sensor having a heat-shutting structure.

Embodiments of the inventive concepts are directed to a stacked image sensor having an air gap.

Embodiments of the inventive concepts are directed to a method for fabricating a stacked image sensor having an air gap.

The objectives of the inventive concepts are not limited to the above-mentioned objectives, and it is obvious to those skilled in the art that there may be other objectives that are not mentioned above.

In accordance with an embodiment of the inventive concepts, a stacked image sensor includes: a lower device including a lower inter-layer dielectric layer over an upper surface of a lower substrate, and a lower capping layer over the lower inter-layer dielectric layer; an upper device stacked over the lower device, including photodiodes in an upper substrate, an upper inter-layer dielectric layer below a lower surface of the upper substrate, and an upper capping layer below the upper inter-layer dielectric layer; and an air gap that is formed between the lower inter-layer dielectric layer and the upper inter-layer dielectric layer.

The lower air gap may include: a lower vertical air gap that is vertically extended by penetrating through the lower capping layer; and a lower horizontal air gap that is horizontally extended inside the lower capping layer.

The lower vertical air gap may penetrate through the upper capping layer to be spatially connected to the upper air gap.

The lower horizontal air gap may include: an inner lower horizontal air gap that is vertically aligned with the photodiodes; and an outer lower horizontal air gap that is vertically aligned with the lower vertical air gap.

The air gap may include: a lower air gap that is defined by the lower inter-layer dielectric layer and the lower capping layer; and an upper air gap that is defined by the upper inter-layer dielectric layer and the upper capping layer.

The upper air gap may include: an upper vertical air gap that is vertically extended by penetrating through the upper capping layer; and an upper horizontal air gap that is horizontally extended inside the upper capping layer.

The upper vertical air gap may be vertically extended to penetrate through the upper inter-layer dielectric layer and the upper substrate.

An upper portion of the upper vertical air gap may be open.

The upper horizontal air gap may include: an inner upper horizontal air gap that is vertically aligned with the photodiodes; and an outer upper horizontal air gap that is vertically aligned with the upper vertical air gap.

The lower air gap and the upper air gap may have a shape of bars that are in parallel with each other or a mesh shape in a top view.

The lower air gap and the upper air gap may be arranged alternately in a horizontal direction.

The stacked image sensor may further include: a gap pillar that is vertically aligned with the air gap and vertically penetrates through the upper inter-layer dielectric layer and the upper substrate.

A side of the air gap may be open.

In accordance with another embodiment of the inventive concepts, a stacked image sensor includes: a lower device; and an upper device that is stacked over the lower device. The lower device may include: transistors that are formed over an upper surface of a lower substrate; lower lines over the transistors; a lower inter-layer dielectric layer suitable for covering the transistors and the lower lines; a lower capping layer that is disposed over the lower inter-layer dielectric layer; and a lower air gap that is disposed inside the lower capping layer. The upper device may include: photodiodes that are formed inside an upper substrate; upper lines that are formed below a lower surface of the upper substrate; an upper inter-layer dielectric layer suitable for surrounding the upper lines; and an upper capping layer that is disposed below the upper inter-layer dielectric layer.

The lower air gap may include: a lower vertical air gap that is vertically extended by penetrating through the lower capping layer and the upper capping layer; and a lower horizontal air gap that is horizontally extended inside the lower capping layer.

The upper device may further include: an upper air gap that is defined by the upper inter-layer dielectric layer and the upper capping layer. The upper air gap may include: an upper vertical air gap that penetrates through the upper inter-layer dielectric layer and the upper substrate and is vertically aligned with the lower vertical air gap; and an upper horizontal air gap that is horizontally extended inside the upper capping layer.

The lower horizontal air gap and the upper horizontal air gap may include: an inner lower horizontal air gap and an inner upper horizontal air gap that are vertically aligned with a region where the photodiodes are formed; and an outer lower horizontal air gap and an outer upper horizontal air gap that are vertically aligned with the lower vertical air gap and the upper vertical air gap, respectively.

In accordance with yet another embodiment of the inventive concepts, a stacked image sensor may include: a lower device; and an upper device that is stacked over the lower device. The lower device may include: transistors that are formed over an upper surface of a lower substrate; a lower inter-layer dielectric layer suitable for covering the transistors; and a lower capping layer that is disposed over the lower inter-layer dielectric layer. The upper device may include: photodiodes that are formed inside an upper substrate; an upper inter-layer dielectric layer that is disposed below a lower surface of the upper substrate; an upper capping layer disposed below the upper inter-layer dielectric layer; and an upper air gap inside the upper capping layer.

The upper air gap may include: an upper vertical air gap that is vertically extended by penetrating through the upper inter-layer dielectric layer and the upper substrate; and an upper horizontal air gap horizontally extended inside the upper capping layer.

The lower device may further include: a lower air gap that is defined by the lower inter-layer dielectric layer and the lower capping layer. The lower air gap may includes: a lower vertical air gap that vertically penetrates through the lower capping layer and the upper capping layer and is vertically aligned with the upper vertical air gap; and a lower horizontal air gap that is horizontally extended inside the lower capping layer.

BRIEF DESCRIPTION OF THE DRAWINGS

The above and other features and advantages of the present invention will become more apparent to those skilled in the art to which the present invention pertains by the following detailed description with reference to the attached drawings in which.

DETAILED DESCRIPTION

Figure 1:
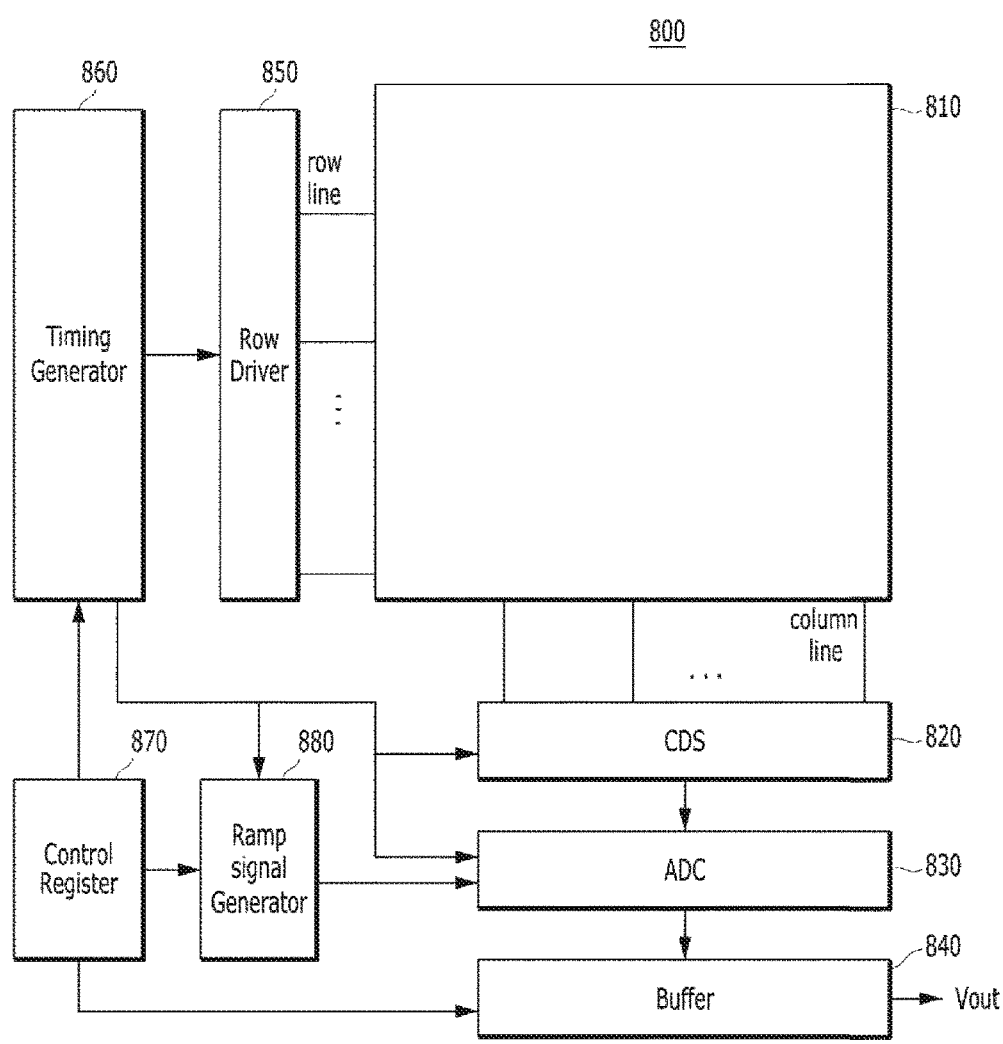
FIG. 1 is a block diagram illustrating an image sensor in accordance with an embodiment of the inventive concepts.

Exemplary embodiments of the inventive concepts will be described below in more detail with reference to the accompanying drawings. The inventive concepts may, however, be embodied in different forms and should not be construed as limited to the embodiments set forth herein. Rather, these embodiments are provided to make this disclosure thorough and complete, and fully convey the scope of the inventive concepts to those skilled in the art. The spirit and scope of the invention are as defined in the claims.

The terms used in this patent specification are for describing the embodiments of the inventive concepts and they do not limit the scope of the inventive concepts. In this specification, the use of a singular term includes a plural term as well unless mentioned otherwise. The use of an expression 'comprises' and/or 'comprising' a constituent element, step, and/or device in this patent specification does not exclude the presence or addition of another constituent element, step, and/or device.

When an element is described in this specification to be 'connected to' or 'coupled to' another element, the description includes not only a direct connection or coupling but also an indirect connection or coupling where yet another element is interposed between them. On the other hand, when an element is described to be 'directly connected to' or 'directly coupled to' another element, the description means that there are no other elements interposed between them. The expression 'and/or' means each of the mentioned items, and all combinations of one or more of the mentioned items.

When a first layer is referred to as being "on" a second layer or "on" a substrate, it not only refers to a case where the first layer is formed directly on the second layer or the substrate but also a case where a third layer exists between the first layer and the second layer or the substrate.

The terms 'below', 'beneath', 'lower', 'above', and 'upper' are spatially relative words, and they may be used to easily describe the correlation between an element or constituent element and another element or constituent element in the drawings. The spatially relative words have to be construed to include not only the direction illustrated in the drawings but also the different directions when the element is used or operates. For example, when a drawing is reversed, an element that is described to be 'below' or 'beneath' of another element may be disposed above the element.

Also, the embodiments of the inventive concepts described in this specification are described with reference to the exemplary drawings which are cross-sectional views and/or plan views. The drawings are not necessarily to scale and in some instances, proportions may have been exaggerated in order to clearly illustrate features of the embodiments. Therefore, the forms of the exemplary drawings may be changed due to a fabrication method and/or tolerance. In this respect, the embodiments of the inventive concepts are not limited to the specific forms illustrated in the drawings, but include a variation in the shape formed according to the fabrication process. For example, a region illustrated to have a right angle may be of a shape having a rounded portion or a predetermined curvature. Therefore, the regions shown in the drawings are roughly illustrated, and the shapes of the regions exemplarily illustrated in the drawings just show specific shapes of the regions of an element and they do not limit the scope of the inventive concepts.

Throughout the disclosure, like reference numerals refer to like parts throughout the various figures and embodiments of the inventive concepts.

FIG. 1 is a block diagram illustrating an image sensor 800 in accordance with an embodiment of the inventive concepts.

Referring to FIG. 1, the image sensor 800 may include a pixel array 810, a correlative double sampler (CDS) 820, an analog-to-digital converter (ADC) 830, a buffer 840, a row driver 850, a timing generator 860, a control register 870, and a ramp signal generator 880.

The pixel array 810 may include a plurality of pixels that are arrayed in a matrix structure. The pixels may convert optical image information into electrical image signals, and transfer the electrical image signals to the correlative double sampler 820 through column lines. Each of the pixels may be coupled to one row line among a plurality of row lines and one column line among a plurality of column lines.

The correlative double sampler 820 may hold and sample the electrical image signals received from the pixels of the pixel array 810. For example, the correlative double sampler 820 may sample the voltage level of the received electrical image signals with a reference voltage level according to a clock signal provided by the timing generator 860 and transfer analog signals corresponding to the difference between the two voltage levels to the analog-to-digital converter 830.

The analog-to-digital converter 830 may convert the received analog signals into digital signals and transfer the digital signals to the buffer 840.

The buffer 840 may receive the digital signals, latch the digital signals, and sequentially output them as the digital signals Vout to an image signal processor (not shown). In some embodiments, the buffer 840 may include a memory for latching the digital signals, and a sense amplifier for amplifying the digital signals.

The row driver 850 may drive the pixels of the pixel array 810 according to a signal outputted from the timing generator 860. For example, the row driver 850 may generate a selection signal for selecting one row line among a plurality of row lines and/or a driving signal for driving the selected row line.

The timing generator 860 may generate a timing signal for controlling the correlative double sampler 820, the analog-to-digital converter 830, the row driver 850, and the ramp signal generator 880.

The control register 870 may generate control signals for controlling the buffer 840, the timing generator 860, and the ramp signal generator 880.

The ramp signal generator 880 may generate a ramp signal for controlling image signals to be outputted from the analog-digital converter 830 to the buffer 840 under the control of the timing generator 860.

FIGS. 2A to 2D are longitudinal cross-sectional views conceptually illustrating stacked image sensors in accordance with diverse embodiments of the inventive concepts.

Figure 2A:
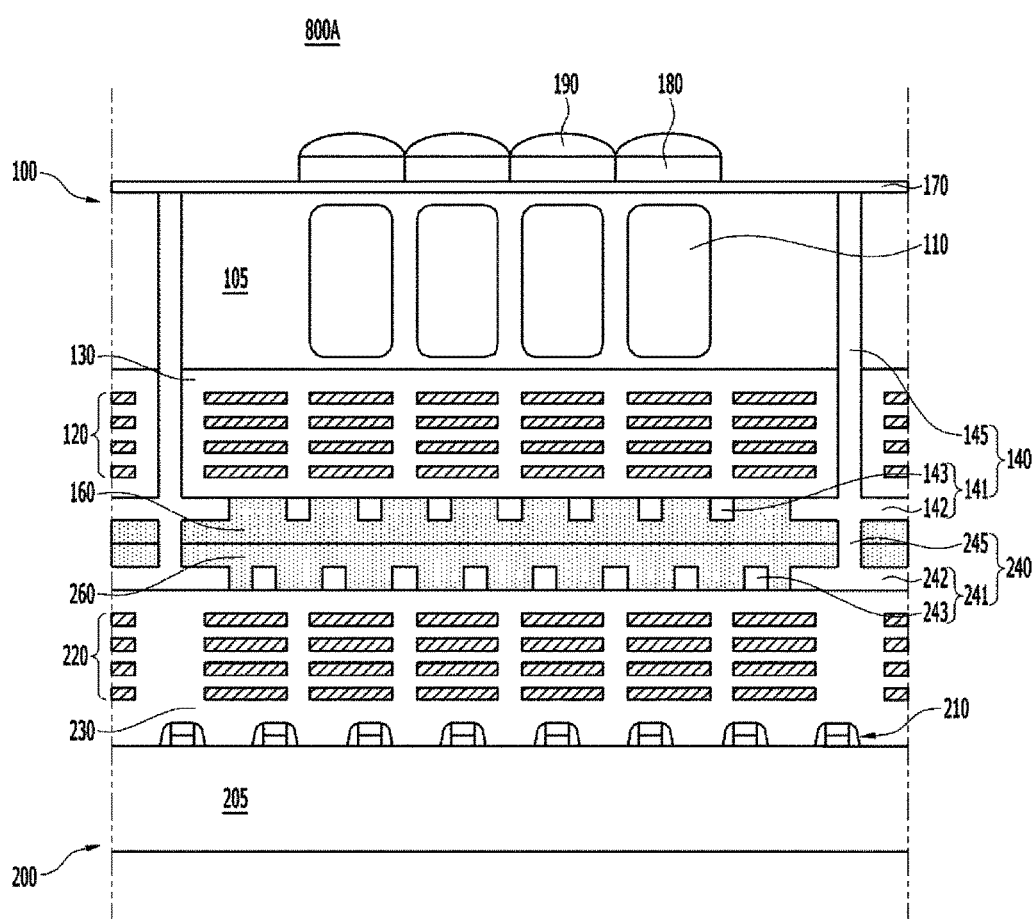
FIGS. 2A to 2G are longitudinal cross-sectional views conceptually illustrating stacked image sensors in accordance with diverse embodiments of the inventive concepts.

Referring to FIG. 2A, a stacked image sensor 800A may include an upper device 100 and a lower device 200. The upper device 100 may be bonded onto the lower device 200.

The upper device 100 may include photodiodes 110 that are disposed in the inside of an upper substrate 105. The upper device 100 may further include a plurality of upper lines 120 disposed inside an upper inter-layer dielectric layer 130, the inter-layer dielectric layer 130 being disposed below the lower surface of the upper substrate 105. The upper device 100 may further include an upper air gap 140 and an upper capping layer 160. The upper device 100 may further include a buffer dielectric layer 170 which is disposed over the upper surface of the upper substrate 105, color filters 180 formed over the buffer dielectric layer 170 and micro lenses 190 which are disposed over the color filters 180. For example, the upper device 100 may include pixels and a pixel circuit.

The upper substrate 105 may include one of a single crystalline silicon wafer, silicon-on-insulator (SOT) wafer, and an epitaxially grown silicon layer. The photodiodes 110 may receive light and generate photocharges out of the light. The photocharges may be converted into electrical signals and transferred to diverse circuits through the upper lines 120. The upper lines 120 may be extended horizontally. The upper lines 120 may include at least one of tungsten (W), a titanium nitride (TiN), nickel (Ni), copper (Cu), and other various metals.

The upper inter-layer dielectric layer 130 may cover or surround the lower surface of the upper substrate 105 and the upper lines 120. The upper inter-layer dielectric layer 130 may include multiple silicon oxide layers (not shown).

The upper air gap 140 may include upper vertical air gaps 145 each having a form of a hole that is extended vertically and an upper horizontal air gap 141 having a form of a trench that is extended horizontally.

Each of the upper vertical air gaps 145 may be extended vertically to penetrate through the upper inter-layer dielectric layer 130 and the upper substrate 105 to expose the buffer dielectric layer 170. The upper vertical air gaps 145 may have a tube shape, a pipe shape, or a hollow pillar shape. The upper vertical air gap 145s may have a circular, triangular, rectangular or a polygonal shape in a top view.

The upper horizontal air gap 141 may have a shape of a trench that is extended horizontally in the inside of the upper capping layer 160. The upper horizontal air gap 141 may have a shape of bars, a shape of stripes, or a mesh shape in a top view.

The upper horizontal air gap 141 may include outer upper horizontal air gaps 142 and a plurality of inner upper horizontal air gaps 143 disposed between two neighboring outer upper horizontal air gaps 142. The horizontal width of each of the outer upper horizontal air gaps 142 may be wider than the horizontal width of the upper vertical air gaps 145 and the horizontal width of each of the inner upper horizontal air gaps 143. Each of the outer upper horizontal air gaps 142 may be vertically aligned with a corresponding upper vertical air gap 145 to be spatially connected to the corresponding upper vertical air gap 145 directly. The inner upper horizontal air gaps 143 may be spaced apart along the horizontal direction in which the buffer dielectric layer 170 extends within a region inside the upper capping layer 160 which is located vertically below the regions where the upper lines 120 and the photodiodes 110 are disposed.

In the illustrated embodiment of FIG. 2A, there are shown four photodiodes 110 spaced apart at a regular interval inside the upper substrate 105 along the horizontal direction in which the buffer dielectric layer 170 extends. The plurality of upper lines 120 are disposed within the upper inter-layer dielectric layer 130 in six groups which are spaced apart at a regular interval along the horizontal direction in which the buffer dielectric layer 170 extends between two neighboring upper vertical air gaps 145. Each of the six groups of the upper lines 120 includes four parallel upper lines 120. The four central groups of the upper lines 120 are each vertically aligned below a corresponding one of the four photodiodes 110.

The upper capping layer 160 may cover the sides and lower surfaces of the upper horizontal air gap 141. The upper capping layer 160 may include a silicon oxide. Therefore, the upper horizontal air gap 141 may be defined by the upper inter-layer dielectric layer 130 and the upper capping layer 160. For example, the upper surface of the upper horizontal air gap 141 may be defined by the upper inter-layer dielectric layer 130, and the sides and the lower surface of the upper horizontal air gap 141 may be defined by the upper capping layer 160.

According to another embodiment of the inventive concepts, the sides of the outer upper horizontal air gaps 142 may not be surrounded by the upper capping layer 160 but may be kept open.

The lower device 200 may include logic transistors 210, lower lines 220, a lower inter-layer dielectric layer 230, a lower air gap 240, and a lower capping layer 260 all of which disposed over the upper surface of a lower substrate 205. For example, the lower device 200 may include a logic circuit.

The lower substrate 205 may include one of a single crystalline silicon wafer, silicon-on-insulator (SOT) wafer, and an epitaxially grown silicon layer. The logic transistors 210 may form various logic circuits and input/output circuits. The lower lines 220 may transfer various electrical signals in a horizontal direction. The lower lines 220 may include at least one of tungsten (W), a titanium nitride (TiN), nickel (Ni), copper (Cu), and other various metals.

The lower inter-layer dielectric layer 230 may cover or surround the lower substrate 205, the lower lines 220 and the logic transistors 210. The lower inter-layer dielectric layer 230 may include multiple silicon oxide layers (not shown).

The lower air gap 240 may include lower vertical air gap 245s each having a form of a hole that is extended vertically and a lower horizontal air gap 241 having a form of a trench that is extended horizontally.

Each of the lower vertical air gaps 245 may extend vertically to penetrate through the lower capping layer 260 to expose the lower inter-layer dielectric layer 230. Each of the lower vertical air gaps 245 may also extend vertically to penetrate through the upper capping layer 160 and thus spatially connect a lower horizontal air gap 241 with a corresponding upper horizontal air gap 141. The lower vertical air gap 245 may have a tube shape, a pipe shape, or a hollow pillar shape. The lower vertical air gap 245 may have a circular, triangular, rectangular, or a polygonal shape in a top view. The lower vertical air gaps 245 may be vertically aligned with the corresponding upper vertical air gaps 145 exactly.

The lower horizontal air gap 241 may have a shape of a trench that is extended horizontally in the inside of the lower capping layer 260. The lower horizontal air gap 241 may have a shape of bars, a shape of stripes, or a mesh shape in a top view.

The lower horizontal air gap 241 may include outer lower horizontal air gaps 242 and a plurality of inner lower horizontal air gaps 243 spaced part at a regular interval along the horizontal direction in which the buffer dielectric layer is extended in a region defined between two neighboring outer horizontal air gaps 242. The horizontal width of each of the outer lower horizontal air gaps 242 may be wider than the horizontal width of each of the lower vertical air gap 245 and the horizontal width of each of the inner lower horizontal air gaps 243. The outer lower horizontal air gaps 242 may be vertically aligned with the corresponding lower vertical air gaps 245 to be spatially connected to the corresponding lower vertical air gaps 245 directly. The plurality of the inner lower horizontal air gaps 243 may be vertically aligned with a region where the logic transistors 210 and/or the lower lines 220 are disposed. The lower lines 220 may have the same configuration as the upper lines 120. Specifically, the plurality of the lower lines 220 may be disposed within the lower inter-layer dielectric layer 230 in six groups which are spaced apart at a regular interval along the horizontal direction in which the buffer dielectric layer 170 extends. Each of the six groups of the lower lines 220 includes four parallel lower lines 220 and is vertically aligned exactly with a corresponding group of upper lines 120.

The inner upper horizontal air gaps 143 and the inner lower horizontal air gaps 243 may not be vertically aligned with each other. For example, the inner upper horizontal air gaps 143 and the inner lower horizontal air gaps 243 may be arranged alternately in a horizontal direction.

The lower capping layer 260 may cover the sides and upper surfaces of the lower horizontal air gap 241. The lower capping layer 260 may include a silicon oxide. Therefore, the lower horizontal air gap 241 may be defined by the lower inter-layer dielectric layer 230 and the lower capping layer 260. For example, the lower surface of the lower horizontal air gap 241 may be defined by the lower inter-layer dielectric layer 230, and the sides and the upper surface of the lower horizontal air gap 241 may be defined by the lower capping layer 260. The lower capping layer 260 and the upper capping layer 160 may be directly bonded with each other.

In some embodiments of the inventive concepts, the sides of the outer upper horizontal air gaps 142 may not be surrounded by the upper capping layer 160 but open.

The upper air gap 140 and the lower air gap 240 may block or inhibit the transmission of heat between the lower device 200 and the upper device 100. Particularly, the upper air gap 140 and the lower air gap 240 may block or inhibit the heat generated from the logic transistors 210 and the lower lines 220 of the lower device 200 from being transmitted to the photodiodes 110 and the upper lines 120 of the upper device 100. Therefore, the upper air gap 140 and the lower air gap 240 may prevent or inhibit the generation of heat charges in the photodiodes 110, and prevent or inhibit the resistance of the upper lines 120 from being changed. Also, the upper air gap 140 and the lower air gap 240 may decrease the parasitic capacitance of the neighboring conductors.

Figure 2B:
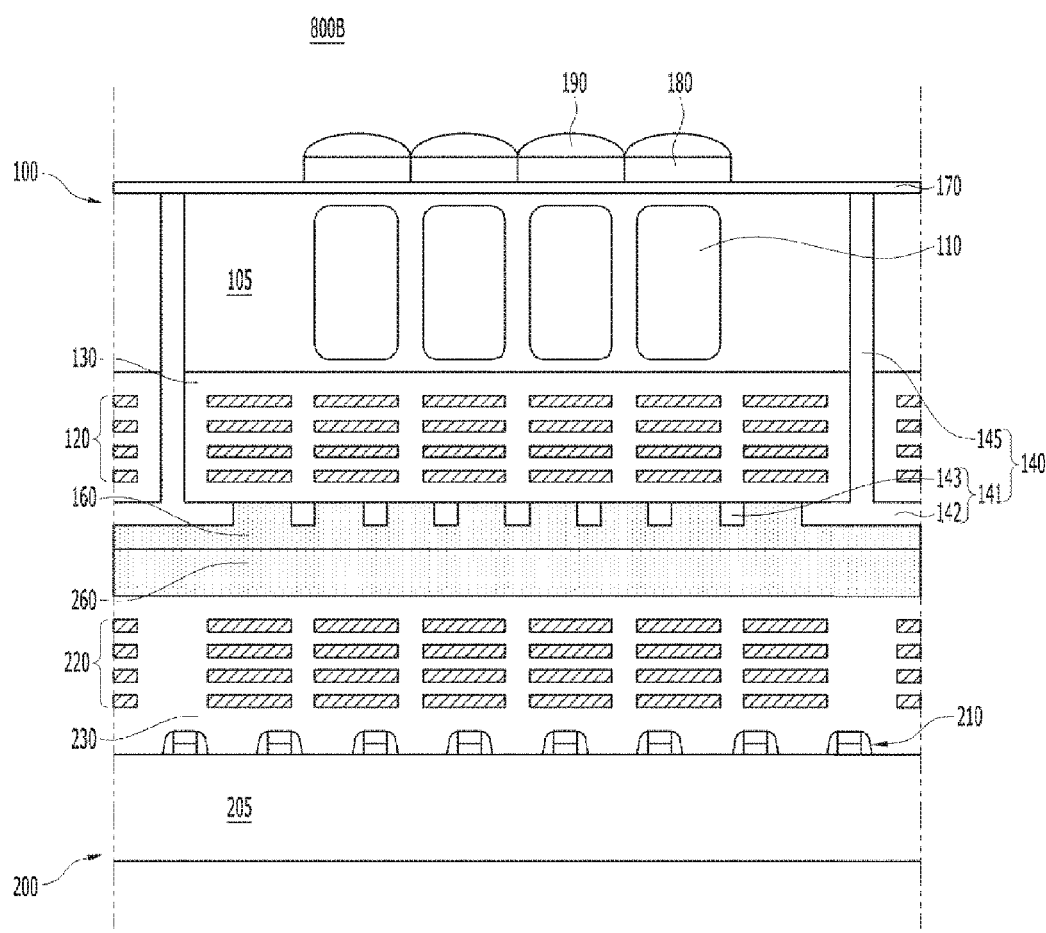

Referring to FIG. 2B, a stacked image sensor 800B may not include the lower air gap 240, compared with the constituent elements of the stacked image sensor 800A illustrated in FIG. 2A. According to another embodiment of the inventive concepts, which is an expanded embodiment of the inventive concepts, the inner upper horizontal air gaps 143 of the upper air gap 140 may be formed in a shape that is horizontally wider than the illustrated shape of the inner upper horizontal air gaps 143.

Figure 2C:
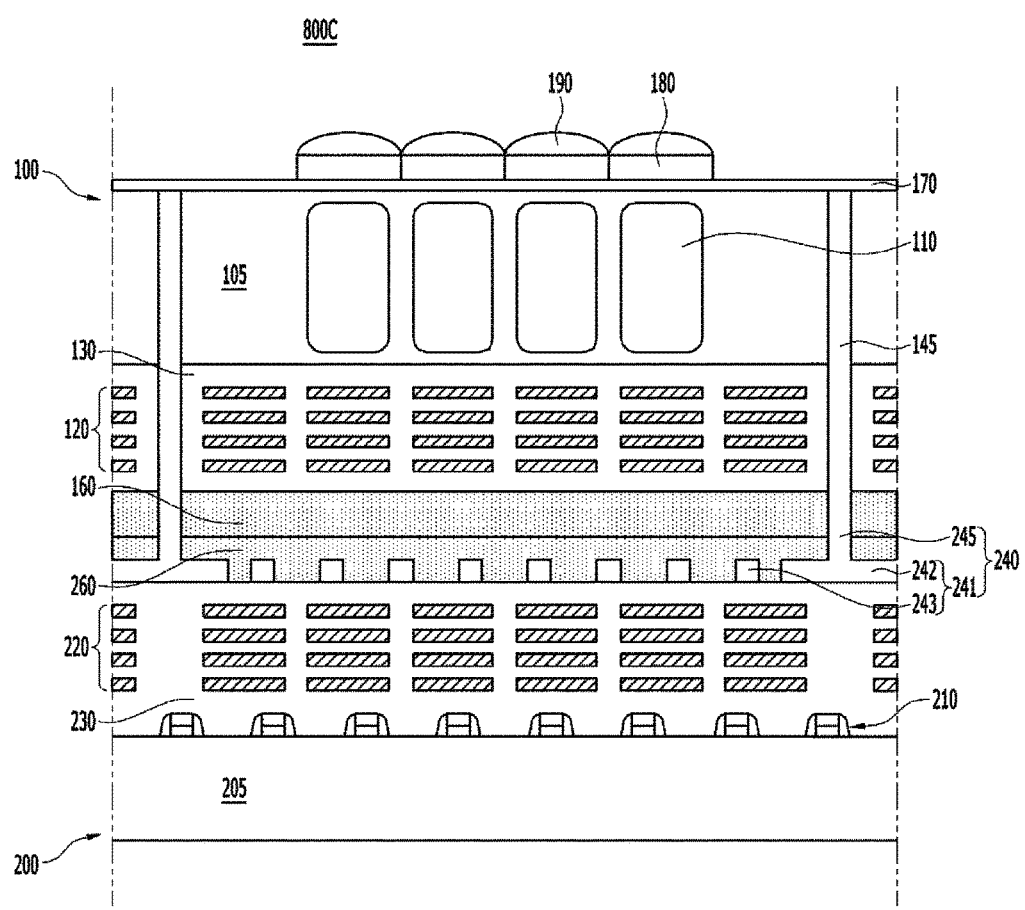

Referring to FIG. 2C, a stacked image sensor 800C may not include the upper horizontal air gap 141, compared with the constituent elements of the stacked image sensor 800A illustrated in FIG. 2A. The upper vertical air gaps 145 may be exactly aligned with the corresponding lower vertical air gaps 245. In some embodiments of the inventive concepts, the inner lower horizontal air gaps 243 may be formed in a shape that is horizontally wider than the illustrated shape of the inner lower horizontal air gaps 243.

Figure 2D:
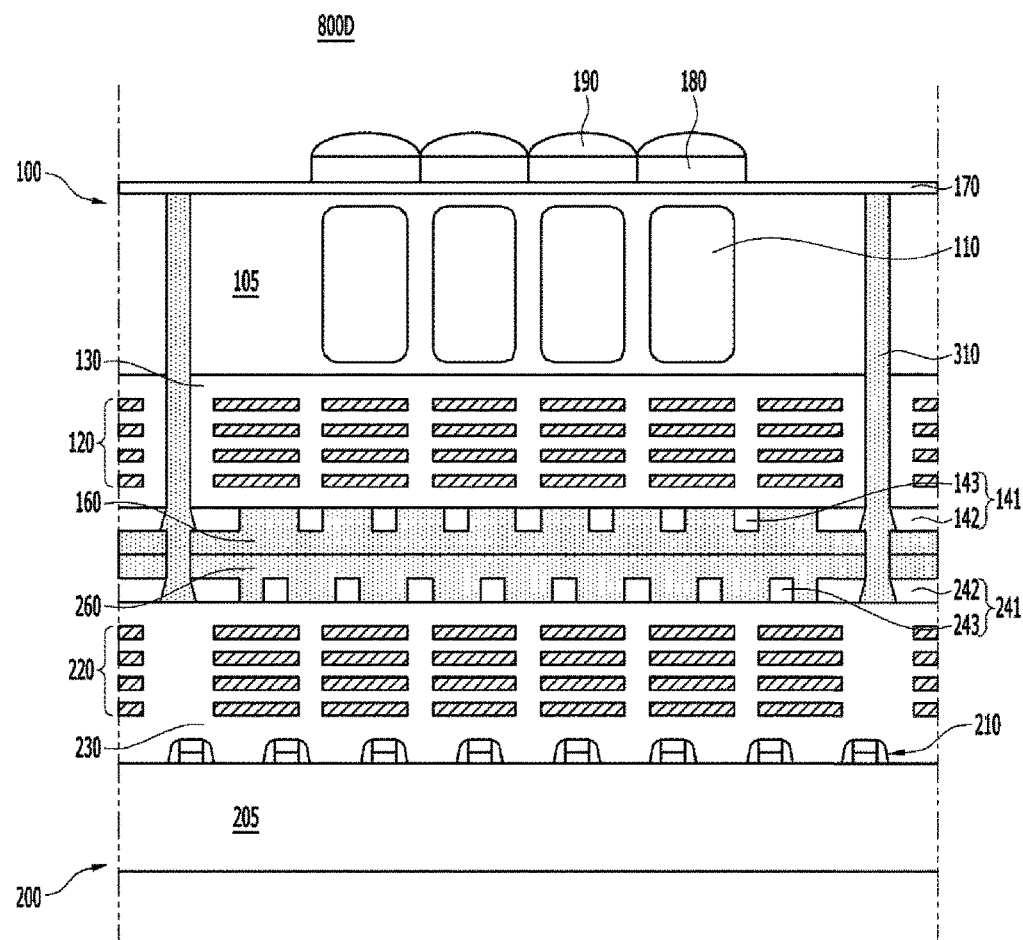

Referring to FIG. 2D, a stacked image sensor 800D in accordance with an embodiment of the inventive concepts may include gap pillars 310 instead of the upper vertical air gaps 145 and the lower vertical air gaps 245, compared with the constituent elements of the stacked image sensors 800A to 800C illustrated in FIGS. 2A to 2C.

The gap pillars 310 may include a filling material that fills the upper vertical air gaps 145 and the lower vertical air gaps 245. The filling material may include a silicon oxide. The gap pillars 310 may have slanted sides like a trapezoid in the regions which are inside of the upper horizontal air gap 141 and the lower horizontal air gap 241.

Figure 2E:
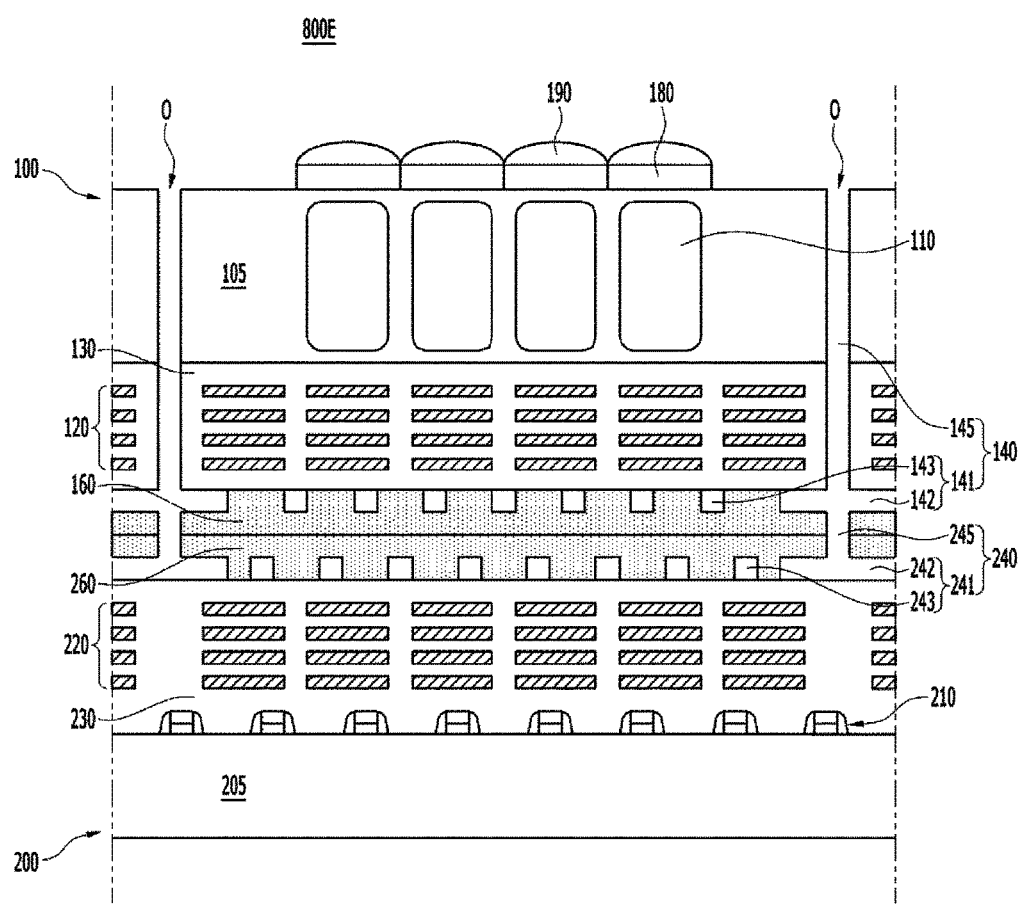

Referring to FIG. 2E, a stacked image sensor 800E in accordance with an embodiment of the inventive concepts may not include the buffer dielectric layer 170, compared with the constituent elements of the stacked image sensor 800A illustrated in FIG. 2A. Therefore, the upper portion of the upper vertical air gaps 145 may not be sealed but may stay open with an opening O. This technological concept may be applied to the stacked image sensors 800A, 800B, and 800C illustrated in FIGS. 2A to 2C.

Figure 2F:
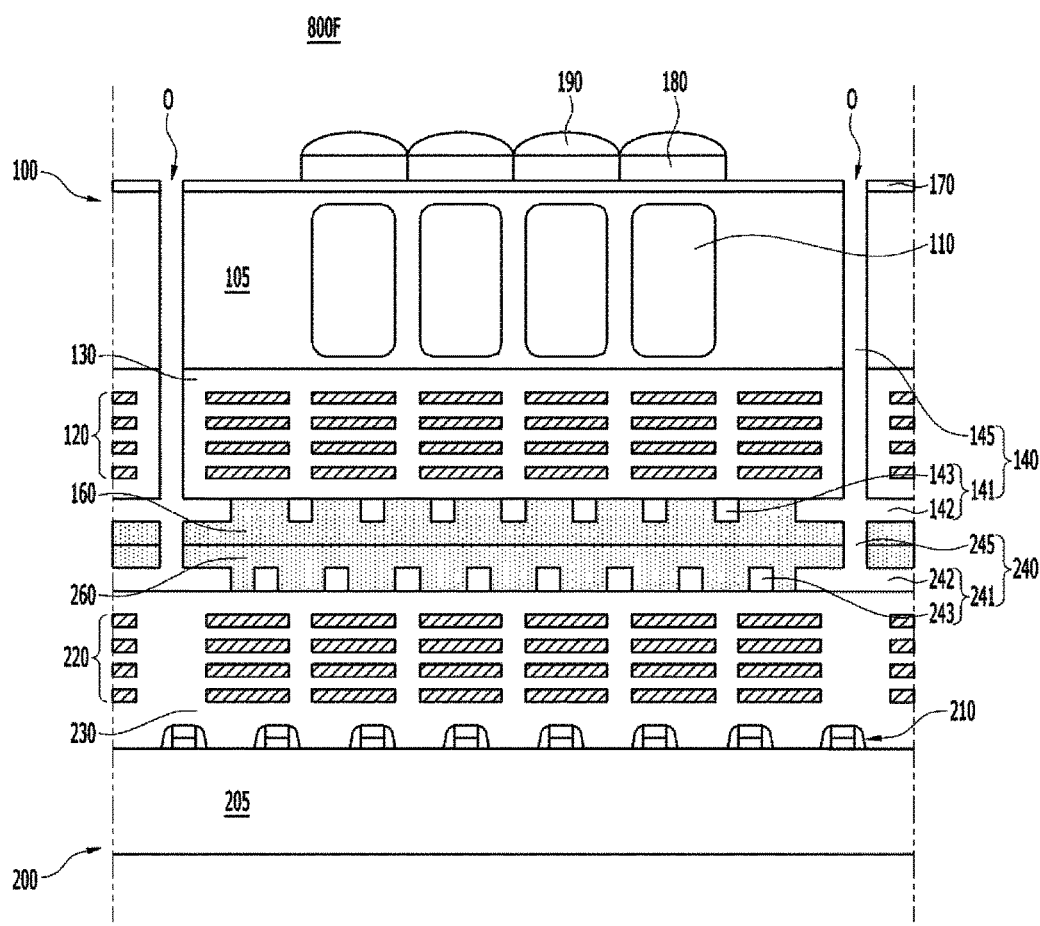

Referring to FIG. 2F, a stacked image sensor 800F in accordance with an embodiment of the inventive concepts may include the buffer dielectric layer 170 provided with an opening O so that the upper portion of the upper vertical air gaps 145 is open, compared with the constituent elements of the stacked image sensor 800A illustrated in FIG. 2A. This technological concept may be applied to the stacked image sensors 800A, 800B and 800C illustrated in FIGS. 2A, 2B and 2C.

Figure 2G:
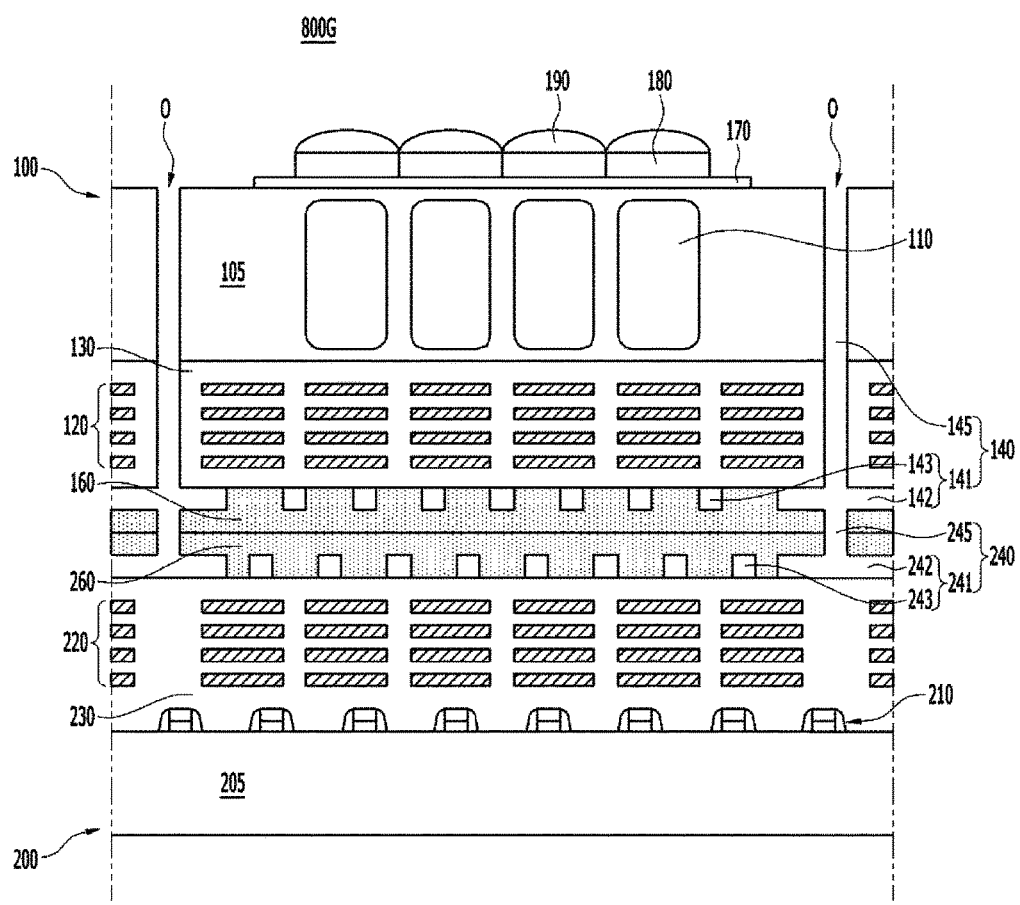

Referring to FIG. 2G, a stacked image sensor 800G in accordance with an embodiment of the inventive concepts may include the buffer dielectric layer 170 that is partially formed over the upper substrate 105 so that the upper portion of the upper vertical air gaps 145 is open with an opening O, compared with the constituent elements of the stacked image sensor 800A illustrated in FIG. 2A. For example, the buffer dielectric layer 170 may be formed between the upper substrate 105 and the color filters 180. The technological concept of this embodiment of the inventive concepts may be applied to the stacked image sensors 800B and 800C illustrated in FIGS. 2B and 2C, too.

FIGS. 3A to 3H are plan views or layouts conceptually illustrating the upper horizontal air gap 141 and/or lower horizontal air gap 241 of stacked image sensors in accordance with various embodiments of the inventive concepts.

Figure 3A:
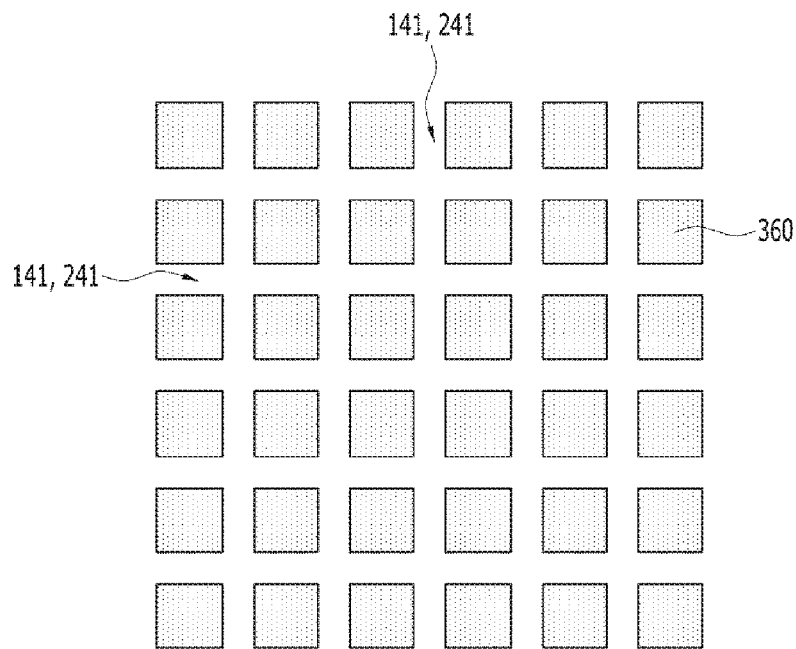
FIGS. 3A to 3H are plan views or layouts conceptually illustrating upper horizontal air gaps and/or lower horizontal air gaps of stacked image sensors in accordance with diverse embodiments of the inventive concepts.
Figure 3B:
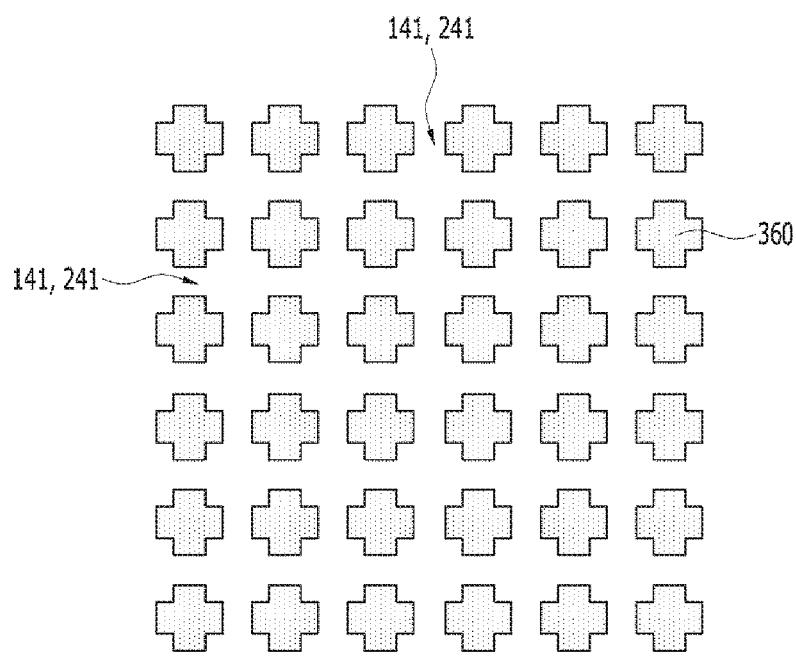
Figure 3C:
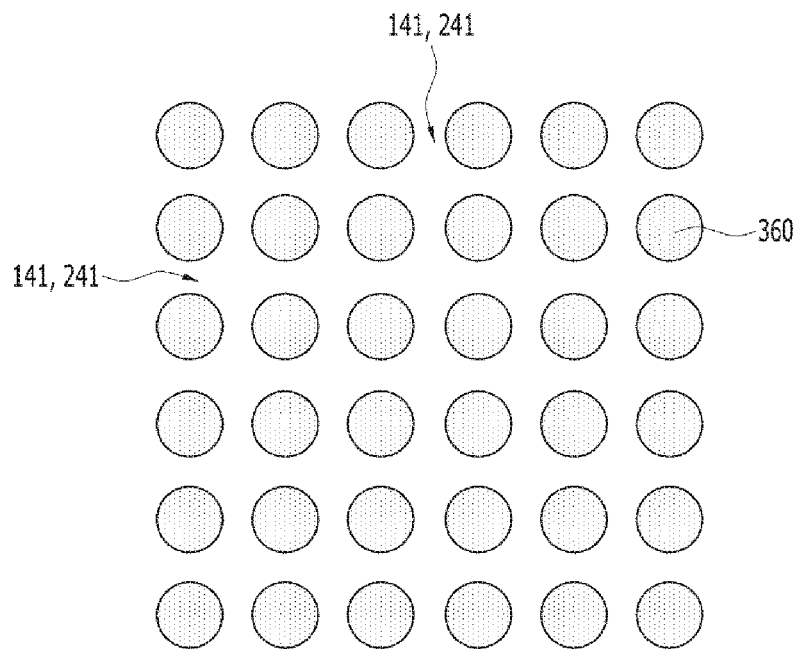
Figure 3D:
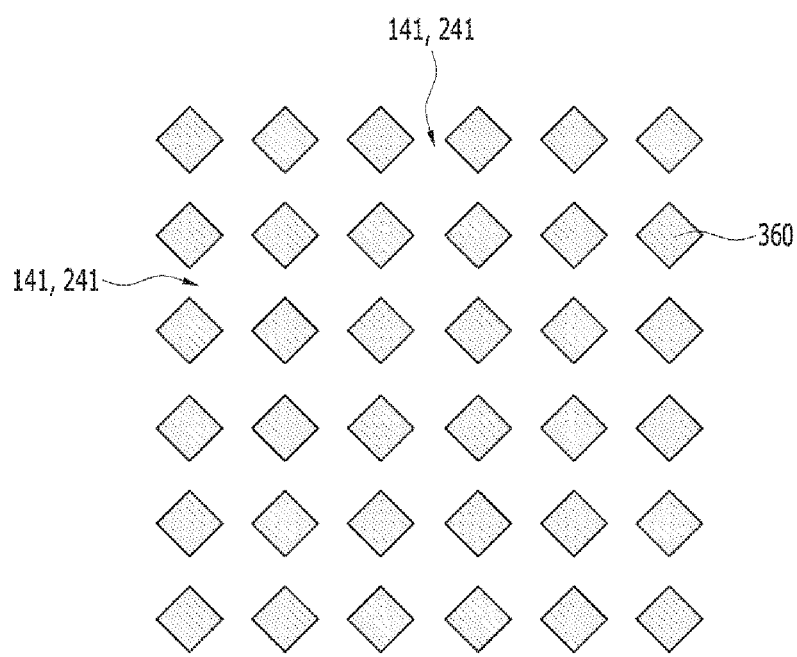

Referring to FIGS. 3A to 3D, the upper horizontal air gap 141 and/or lower horizontal air gap 241 may be arranged in a mesh shape that defines rectangular or polygonal-shaped support patterns 360. The support patterns 360 may be part of the upper capping layer 160 and/or the lower capping layer 260. The support patterns 360 may protect the stacked image sensors 800A to 800C from physical, mechanical and structural stresses between the upper inter-layer dielectric layer 130 and the upper capping layer 160 and/or between the lower inter-layer dielectric layer 230 and the lower capping layer 260. The support patterns 360 may have at least one of square (FIG. 3A), cross (FIG. 3B), circle (FIG. 3C) and lozenge (FIG. 3D) shapes. In the expanded embodiments of the inventive concepts, the support patterns 360 may have more geometrical shapes. Referring to FIGS. 3B to 3D, the space between the neighboring support patterns 360 may have a relatively narrow region and a relatively wide region. In other words, the upper horizontal air gap 141 and/or the lower horizontal air gap 241 may include a region having a relatively wide width and a region having a relatively narrow width.

Figure 3E:
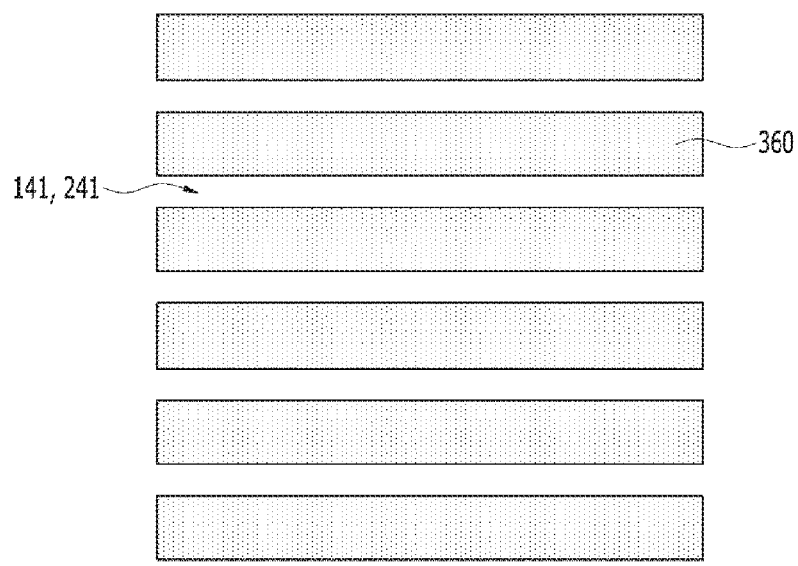
Figure 3F:
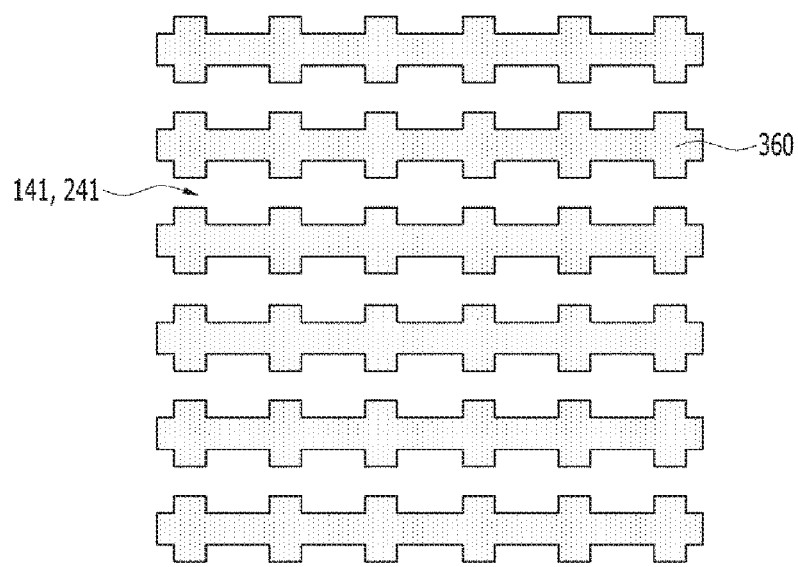
Figure 3G:
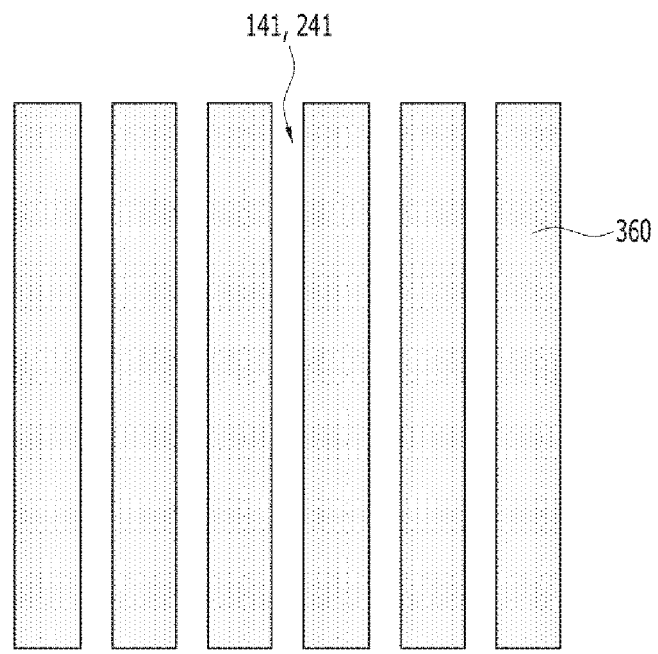
Figure 3H:
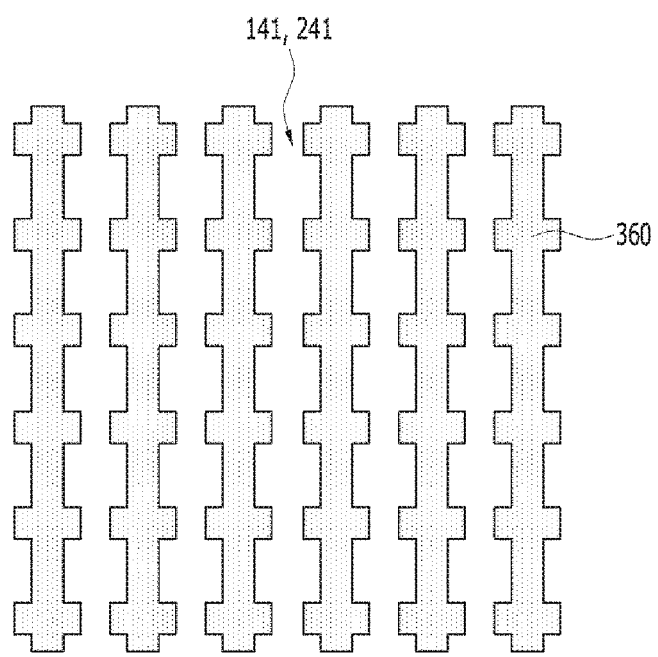

Referring to FIGS. 3E and 3H, the upper horizontal air gap 141 and/or lower horizontal air gap 241 in accordance with various embodiments of the inventive concepts may include a plurality of bars that are in parallel with each other. In some embodiments, the upper horizontal air gap 141 and/or lower horizontal air gap 241 may have a shape of stripes (FIGS. 3E, 3G). Alternatively, two sides of each of the support patterns 360 may have a concavo-convex shape (FIGS. 3F, 3H). In other words, the upper horizontal air gap 141 and/or lower horizontal air gap 241 may include a region having a relatively wide width and a region having a relatively narrow width.

FIGS. 4A to 4J are longitudinal cross-sectional views conceptually illustrating methods for fabricating a stacked image sensor in accordance with various embodiments of the inventive concepts.

Figure 4A:
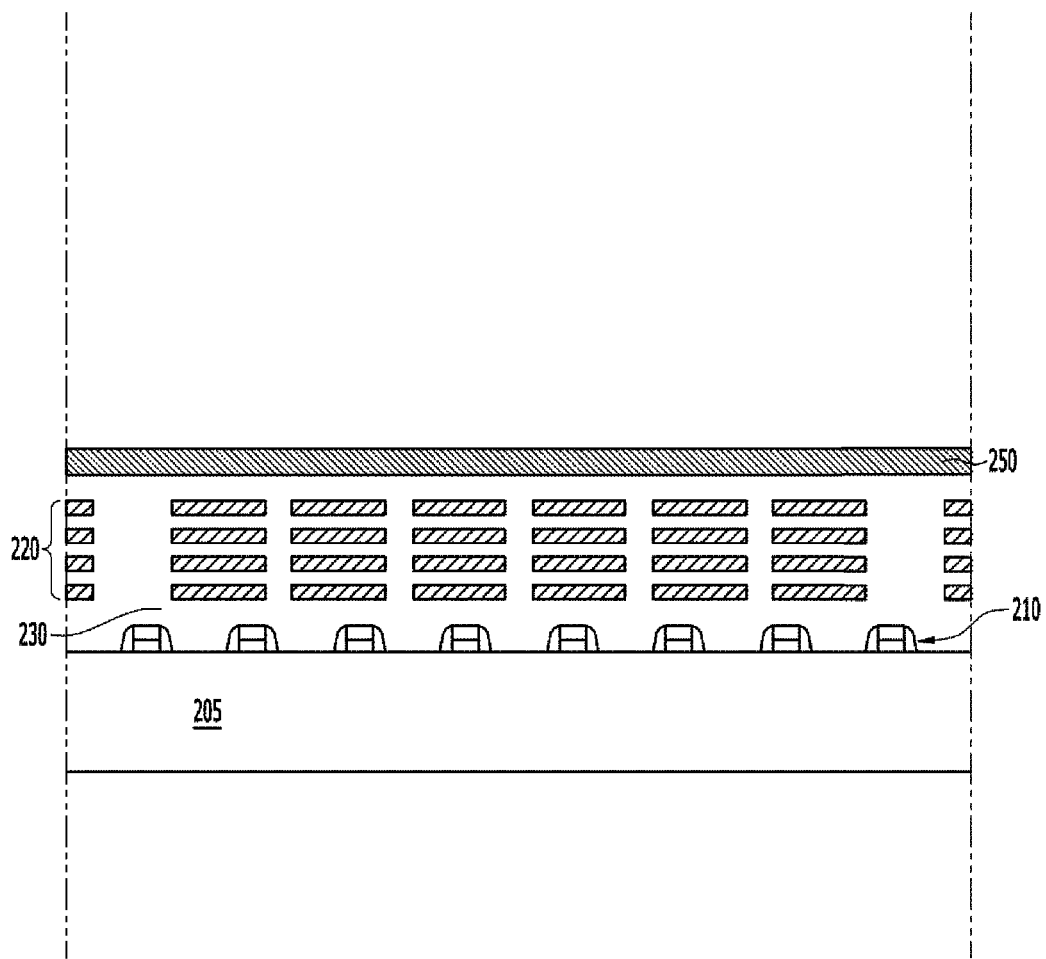
FIGS. 4A to 4B, 5A to 5D, 6A to 6C and 7 are longitudinal cross-sectional views conceptually illustrating methods for fabricating a stacked image sensor in accordance with diverse embodiments of the inventive concepts.
Figure 4B:
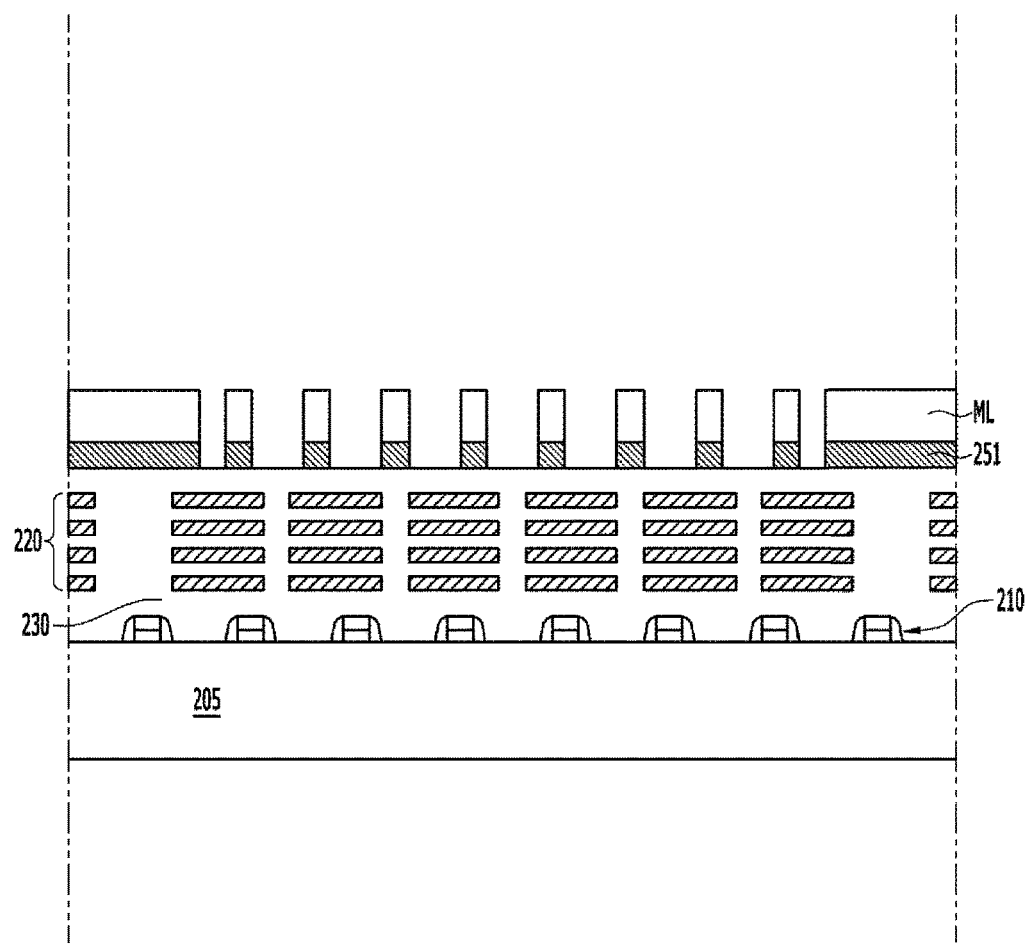

Referring to FIG. 4A, a method for fabricating a stacked image sensor may include forming logic transistors 210, lower lines 220, a lower inter-layer dielectric layer 230, and a lower sacrificial layer 250 over a lower substrate 205.

The lower substrate 205 may include one of a single crystalline silicon wafer, a silicon-on-insulator (SOI) wafer, and an epitaxially grown silicon layer. The lower lines 220 and the lower inter-layer dielectric layer 230 may be formed in multiple layers, individually. The lower inter-layer dielectric layer 230 may sufficiently cover the uppermost lower lines 220. The lower inter-layer dielectric layer 230 may include a silicon oxide, such as tetra-ethyl-ortho silicate (TEOS) or high density plasma (HDP) oxide. The lower sacrificial layer 250 may have a wet etch selectivity with respect to the lower inter-layer dielectric layer 230. For example, the lower sacrificial layer 250 may include a silicon nitride. After the lower inter-layer dielectric layer 230 is formed and/or after the lower sacrificial layer 250 is formed, a planarization process such as a Chemical Mechanical Polishing (CMP) process, may be further performed Referring to FIG. 4B, the method may include forming a lower sacrificial pattern 251 by forming a lower mask pattern ML over the lower sacrificial layer 250 and performing an etch process. The lower mask pattern ML may include a hard mask such as a photoresist or a silicon nitride. The lower sacrificial pattern 251 may have one among the arrangements that are described by referring to FIGS. 3A to 3H. Subsequently, the lower mask pattern ML may be removed.

Figure 4C:
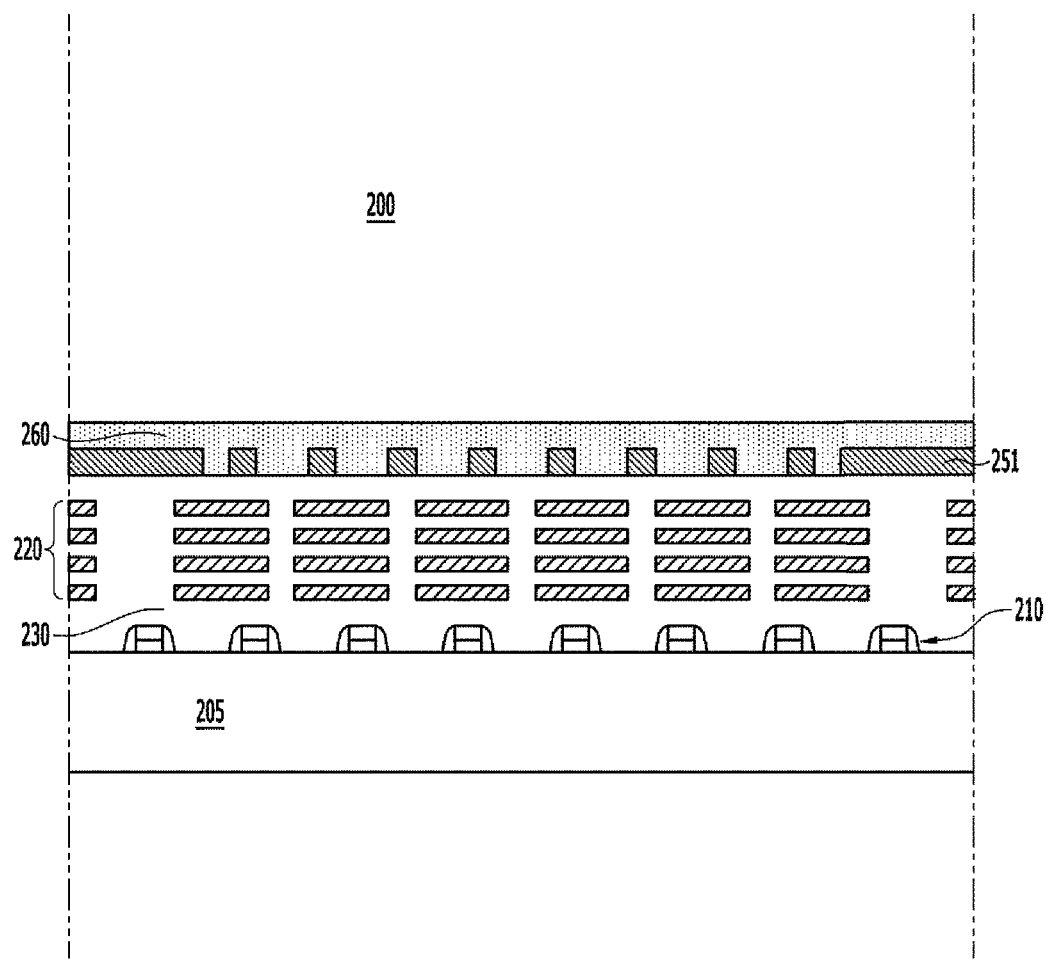

Referring to FIG. 4C, the method may include forming a lower capping layer 260 that completely covers the lower sacrificial pattern 251. The lower capping layer 260 may include a silicon oxide such as an HDP oxide. A lower device 200 may be formed by performing the processes that are described above with reference to FIGS. 4A to 4C.

Figure 4D:
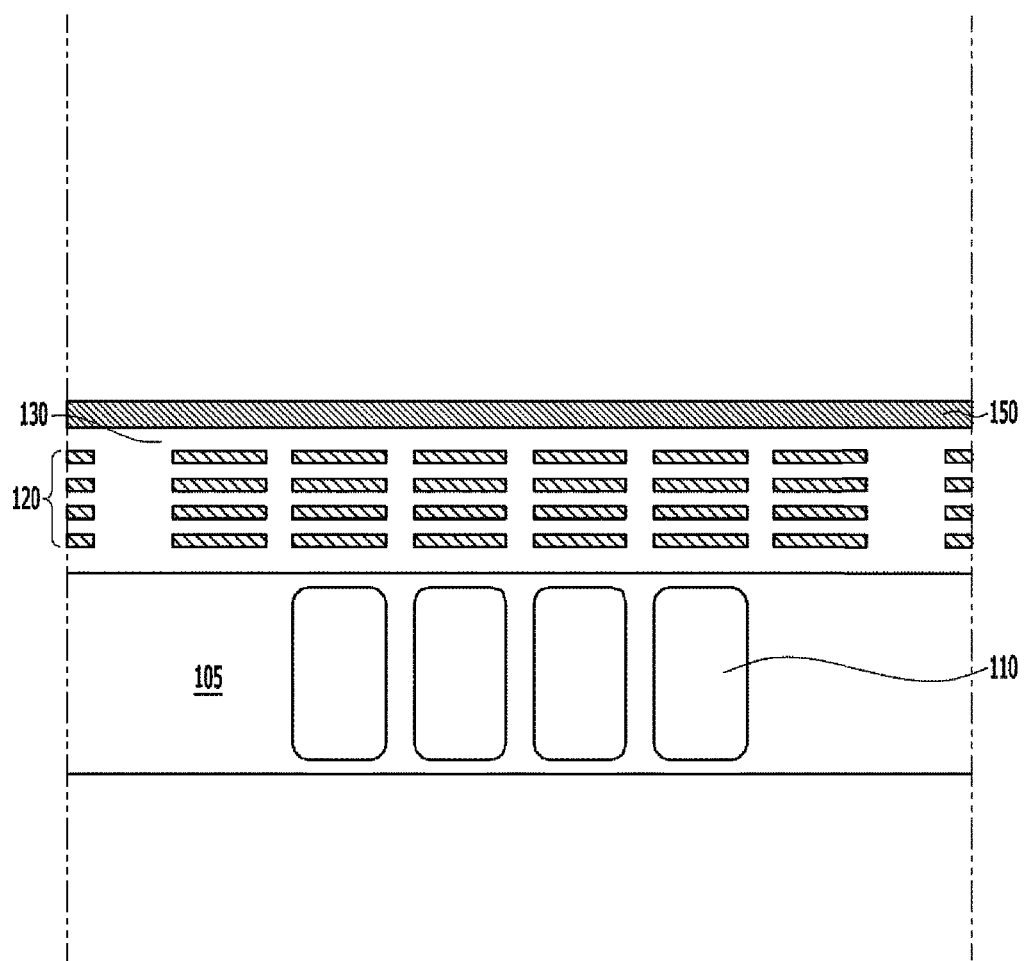
Figure 4E:
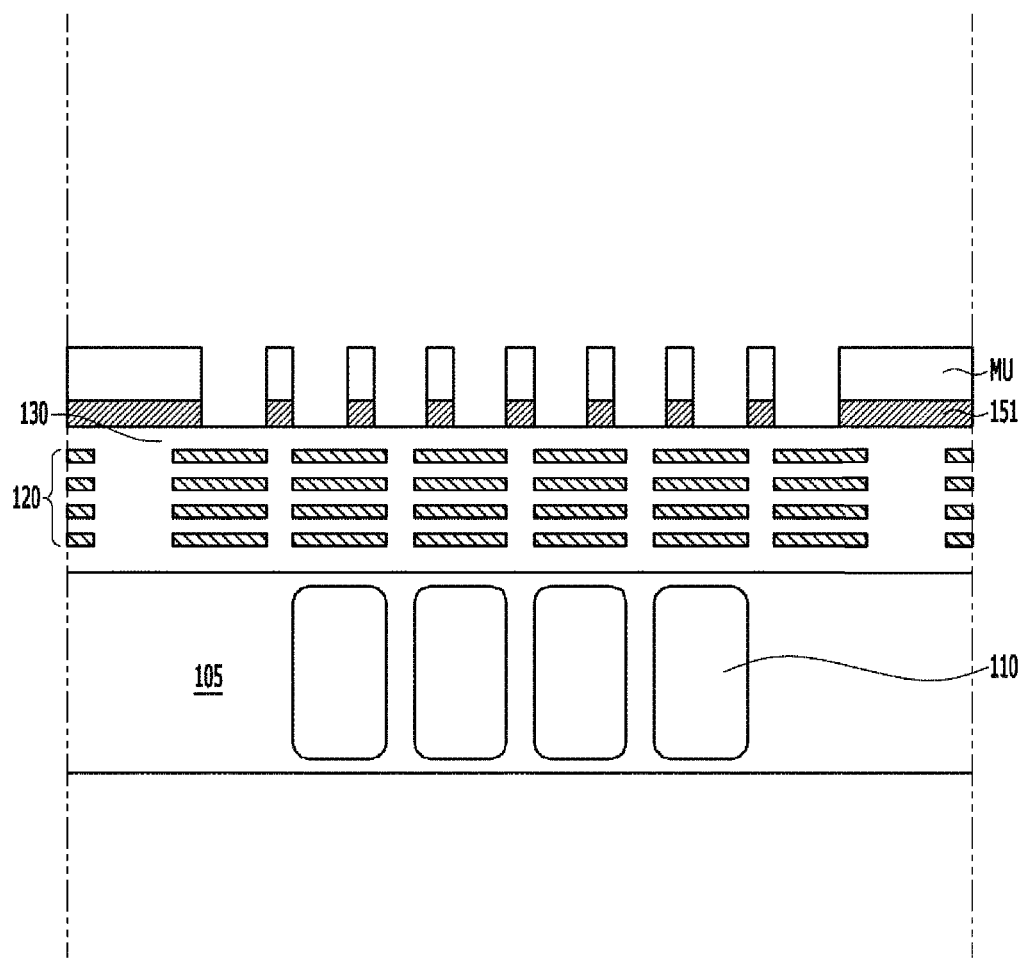

Referring to FIG. 4D, the method may include forming photodiodes 110 in the inside of the upper substrate 105, and forming upper lines 120, an upper inter-layer dielectric layer 130, and an upper sacrificial layer 150 over the upper substrate 105. The upper substrate 105 may include one of a single crystalline silicon wafer, a silicon-on-insulator (SOI) wafer, and an epitaxially grown silicon layer. The photodiodes 110 may be formed by performing an ion implantation process onto the upper substrate 105. The upper lines 120 may include a metal. The upper inter-layer dielectric layer 130 may sufficiently cover the uppermost upper lines 120. The upper inter-layer dielectric layer 130 may include a silicon oxide, such as tetra-ethyl-ortho silicate (TEOS) or high density plasma (HDP) oxide. The upper sacrificial layer 150 may have a wet etch selectivity with respect to the upper inter-layer dielectric layer 130. For example, the upper sacrificial layer 150 may include a silicon nitride. After the upper inter-layer dielectric layer 130 is formed and/or after the upper sacrificial layer 150 is formed, a planarization process such as a Chemical Mechanical Polishing (CMP) process, may be further performed Referring to FIG. 4E, the method may include forming an upper sacrificial pattern 151 by forming an upper mask pattern MU over the upper sacrificial layer 150 and performing an etch process. The upper mask pattern MU may include a hard mask such as a photoresist or a silicon nitride. The upper sacrificial pattern 151 may have one among the arrangements that are described by referring to FIGS. 3A to 3H. Subsequently, the upper mask pattern MU may be removed.

Figure 4F:
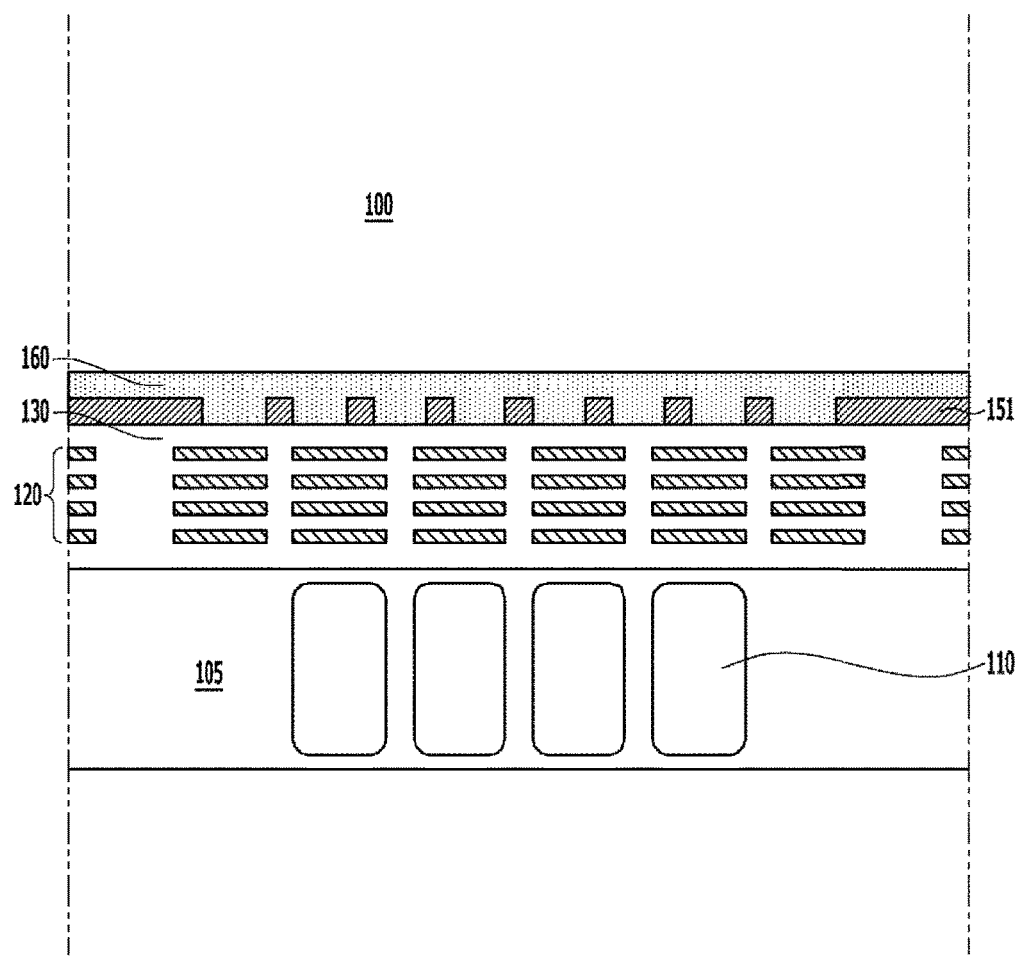

Referring to FIG. 4F, the method may include forming an upper capping layer 160 that completely covers the upper sacrificial pattern 151. The upper capping layer 160 may include a silicon oxide such as a high density plasma (HDP) oxide. An upper device 100 may be formed by performing the processes that are described above with reference to FIGS. 4D to 4F.

Figure 4G:
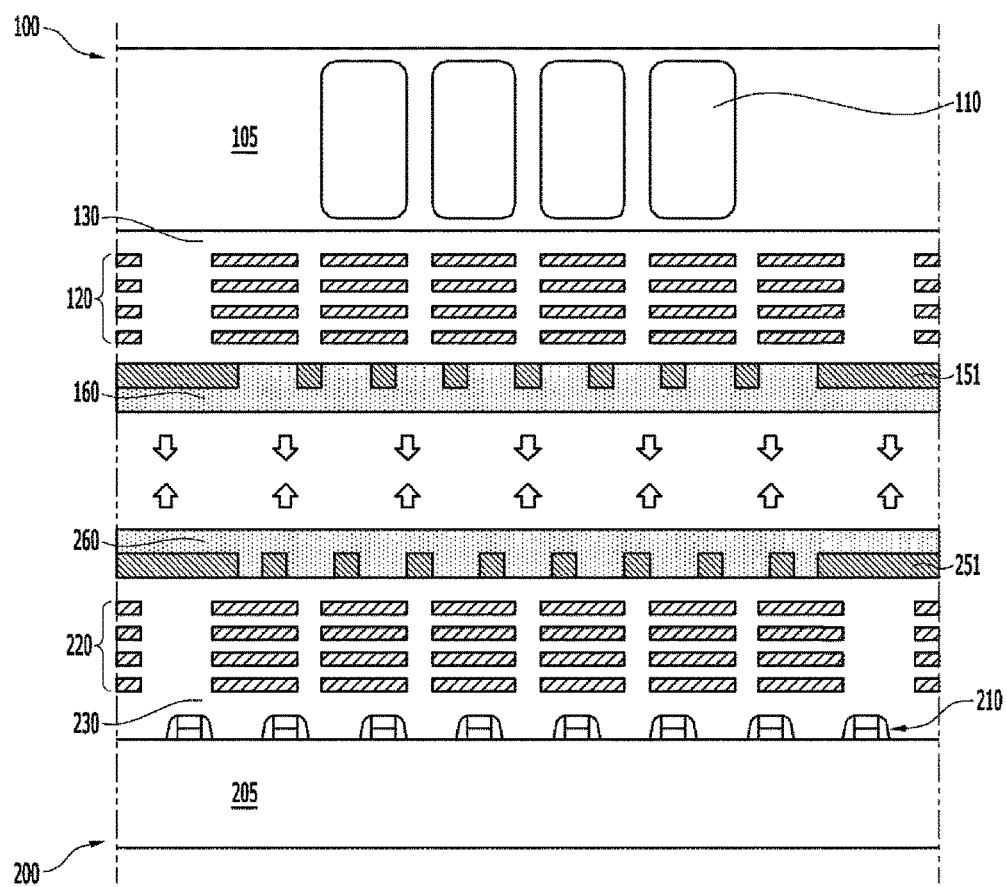

Referring to FIG. 4G, the method may include turning the upper device 100 upside down and stacking the turned upper device 100 over the lower device 200. For example, the method may include bonding the lower capping layer 260 of the lower device 200 with the upper capping layer 160 of the upper device 100.

Figure 4H:
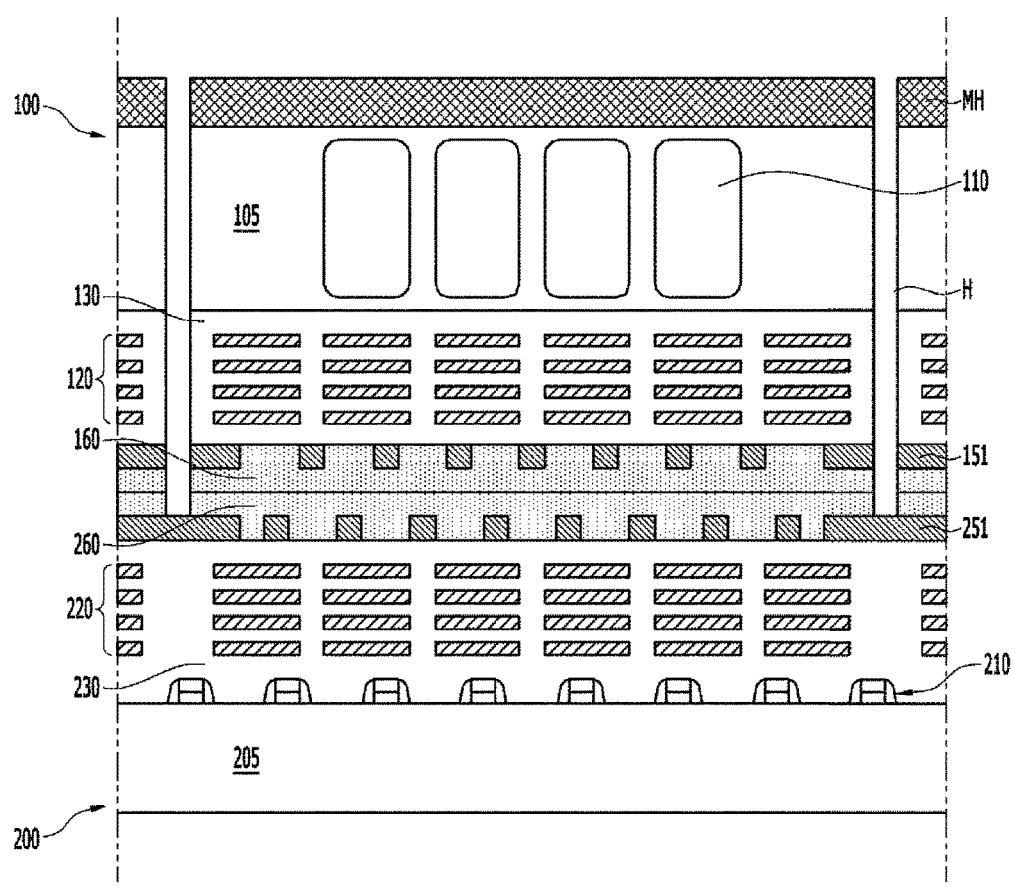

Referring to FIG. 4H, the method may include forming a hole H that penetrates through the upper substrate 105, the upper inter-layer dielectric layer 130, the upper sacrificial pattern 151, the upper capping layer 160, and the lower capping layer 260 and exposes the lower sacrificial pattern 251 by forming a hole mask pattern MH over the upper device 100 and performing an etch process. The hole mask pattern MH may include a hard mask, such as a photoresist or a silicon nitride. Subsequently, the hole mask pattern MH may be removed.

Figure 4I:
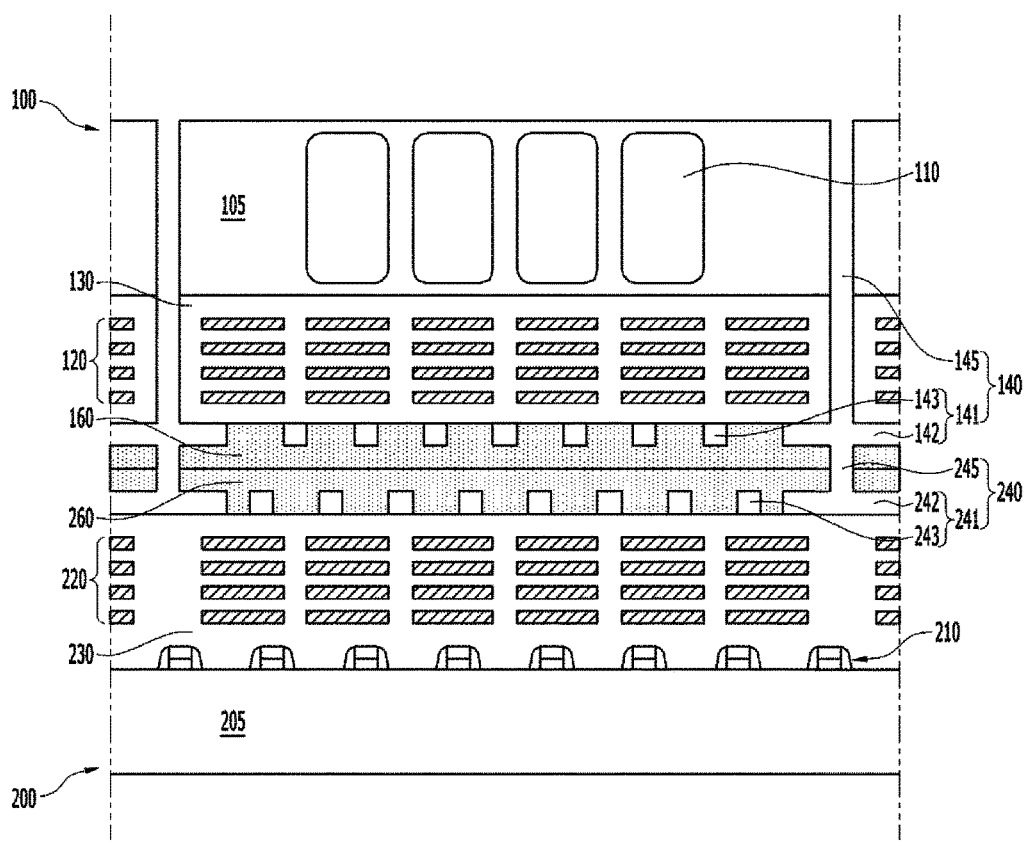

Referring to FIG. 4I, the method may include removing the upper sacrificial pattern 151 and the lower sacrificial pattern 251 by performing a wet etch process. Through the process, an upper air gap 140 and a lower air gap 240 may be formed. In other words, the hole H may be transformed into an upper vertical air gap 145.

Figure 4J:
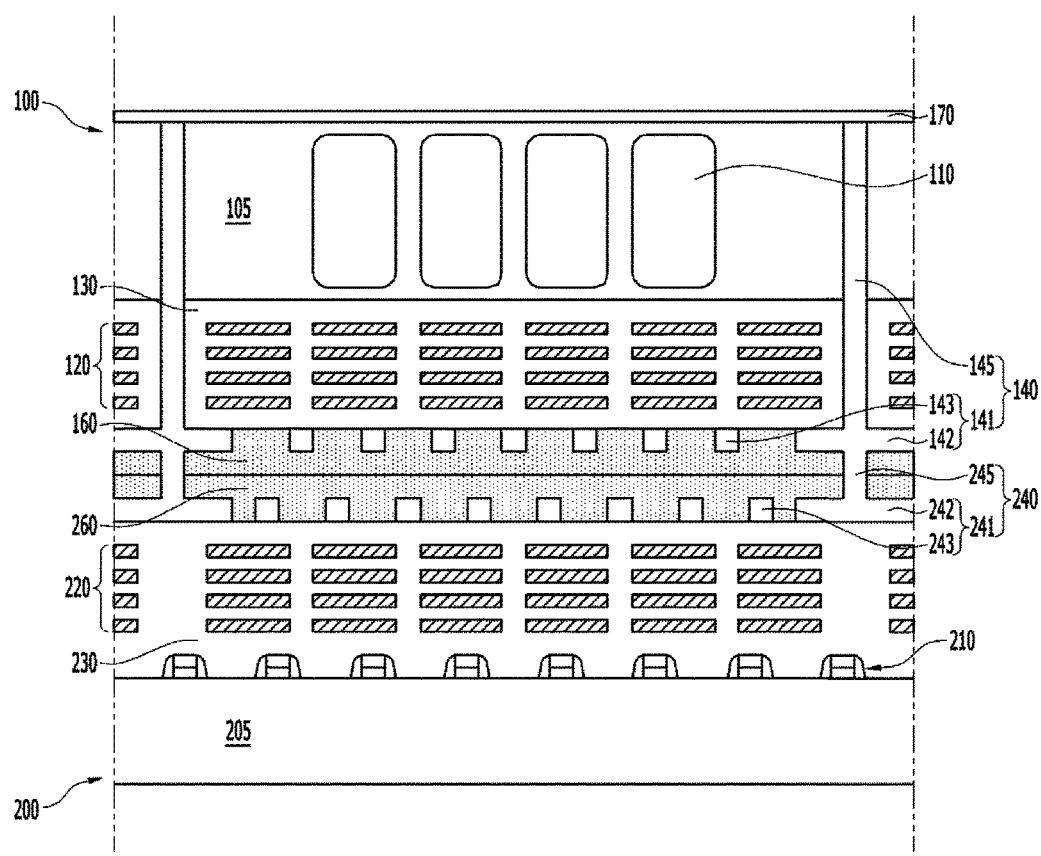

Referring to FIG. 4J, the method may include forming a buffer dielectric layer 170 that seals the upper portion of the upper vertical air gap 145 over the upper device 100 by performing a deposition process. The buffer dielectric layer 170 may include one of a silicon oxide, a silicon nitride, and a combination thereof.

Subsequently, the method may include forming color filters 180 and micro lenses 190 that are aligned with the photodiodes 110 over the buffer dielectric layer 170.

FIGS. 5A to 5D are longitudinal cross-sectional views illustrating a method for fabricating a stacked image sensor in accordance with an embodiment of the inventive concepts.

Figure 5A:
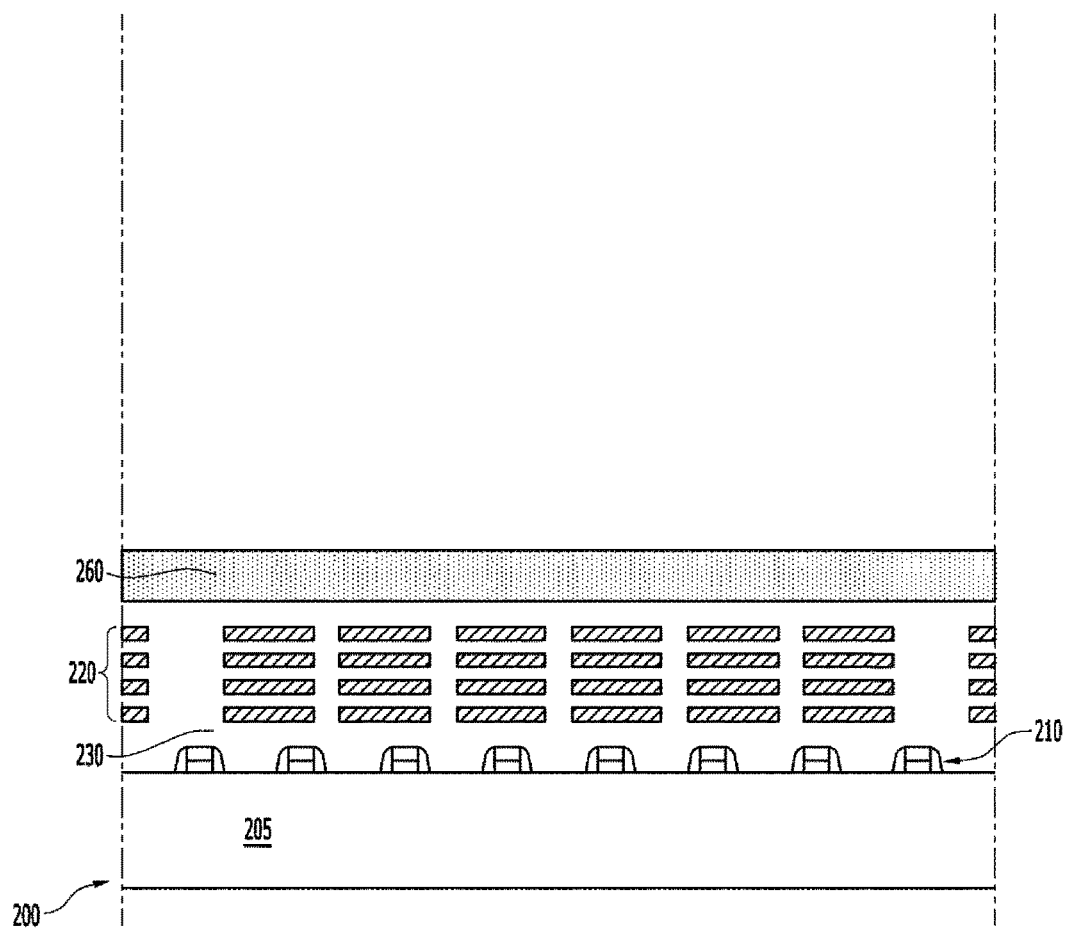

Referring to FIG. 5A, the method for fabricating a stacked image sensor may include forming a lower device 200 including logic transistors 210, lower lines 220, a lower inter-layer dielectric layer 230, and a lower capping layer 260 over a lower substrate 205. Compared with the method described with reference to FIGS. 4A to 4C, the lower sacrificial layer 250 and the lower sacrificial pattern 251 may not be formed.

Figure 5B:
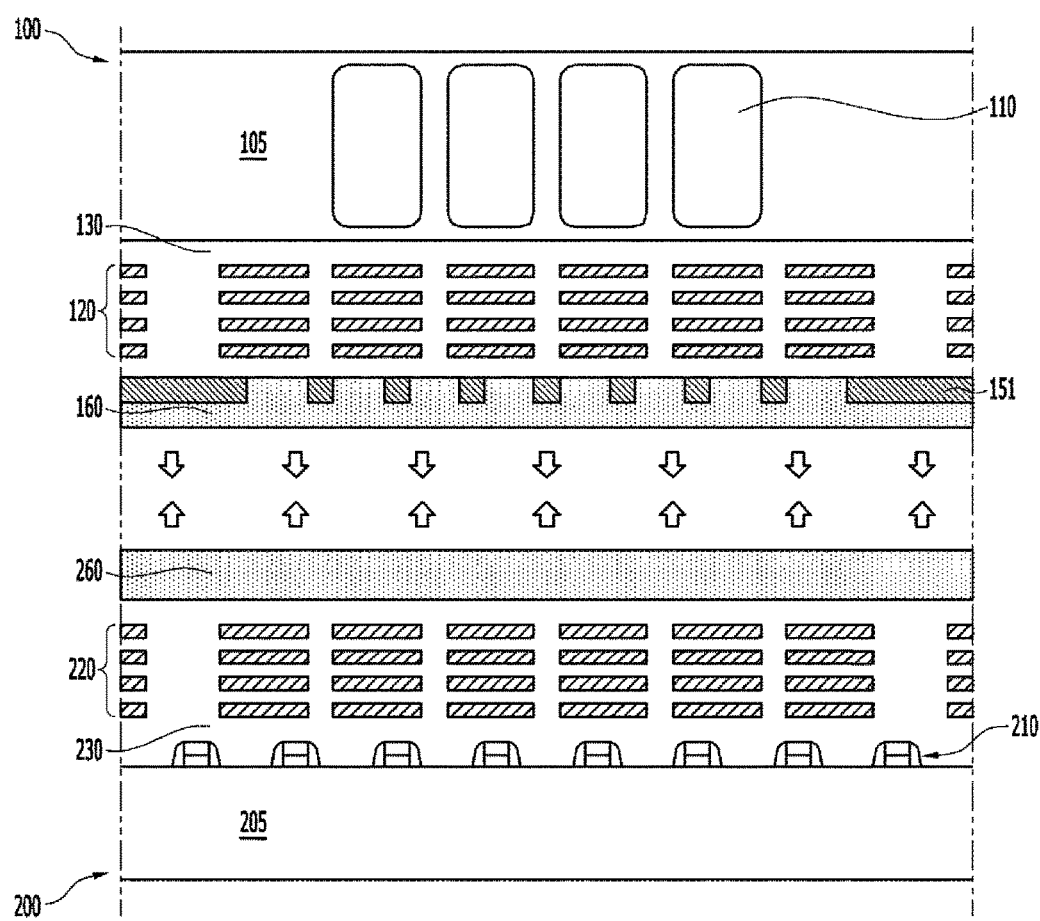

Referring to FIG. 5B, the method may include bonding the upper device 100 with the lower device 200 and stacking the upper device 100 over the lower device 200 by performing the processes described with reference to FIGS. 4D and 4G. The upper device 100 may include an upper sacrificial pattern 151.

Figure 5C:
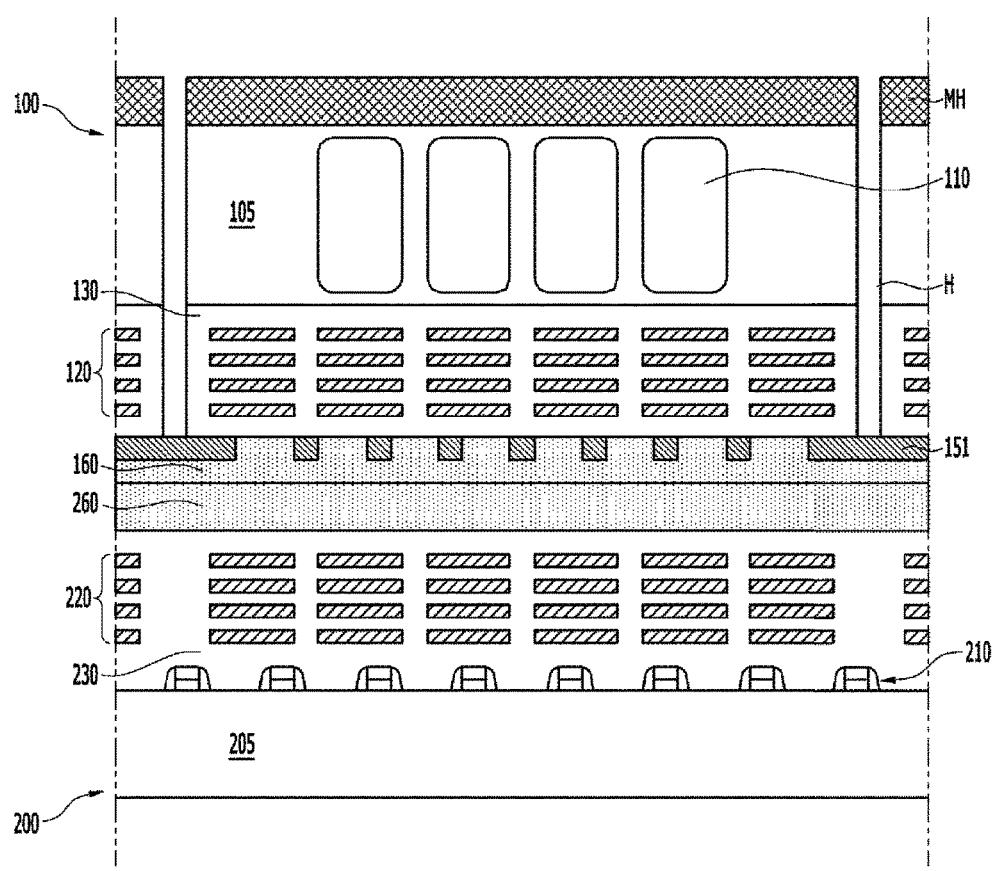

Referring to FIG. 5C, the method may include forming a hole H that penetrates through an upper substrate 105 and an upper inter-layer dielectric layer 130 and exposes an upper sacrificial pattern 151 by forming a hole mask pattern MH over an upper device 100 and performing an etch process. Subsequently, the hole mask pattern MH may be removed.

Figure 5D:
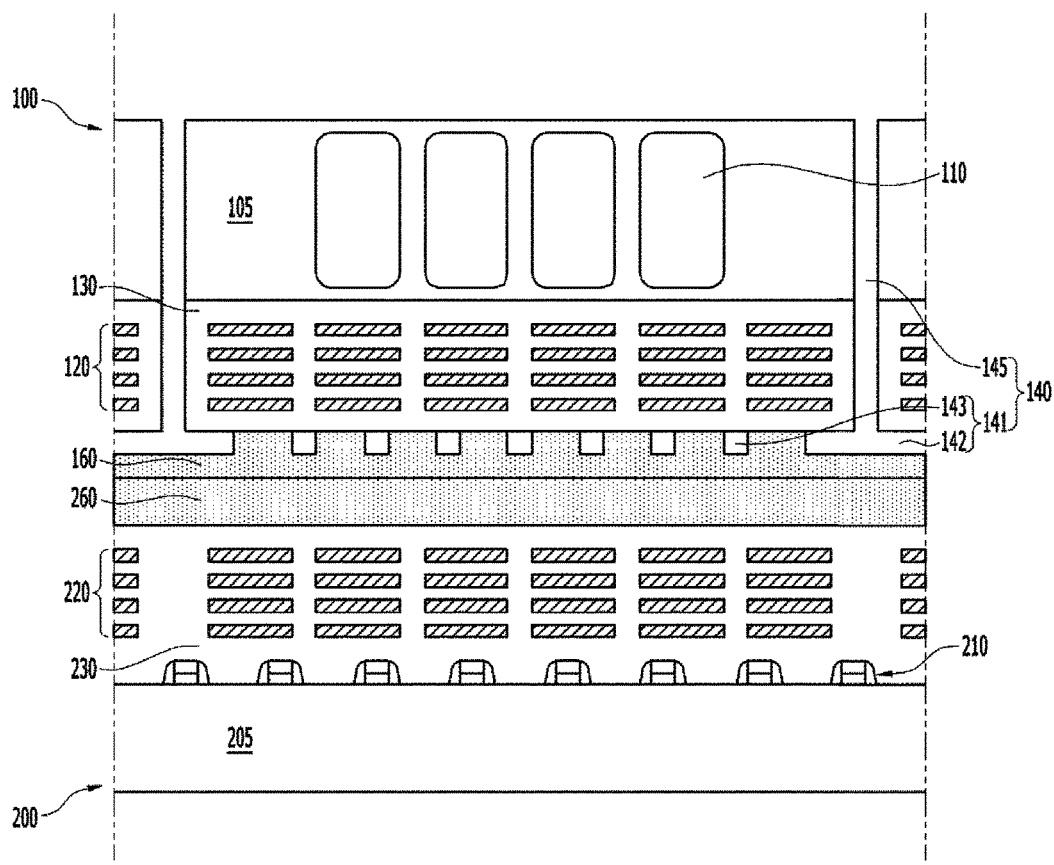

Referring to FIG. 5D, the method may include removing the upper sacrificial pattern 151 by performing a wet etch process. Through the process, an upper vertical air gap 145 may be formed. In other words, the hole H may be transformed into an upper vertical air gap 145. Subsequently, the method may include forming a buffer dielectric layer 170 that seals the upper portion of the upper vertical air gap 145 over the upper device 100 by performing the deposition process that is described by referring to FIG. 4J, and forming color filters 180 and micro lenses 190 that are aligned with the photodiodes 110 over the buffer dielectric layer 170 by performing the process that is described by referring to FIG. 2B.

Figure 6A:
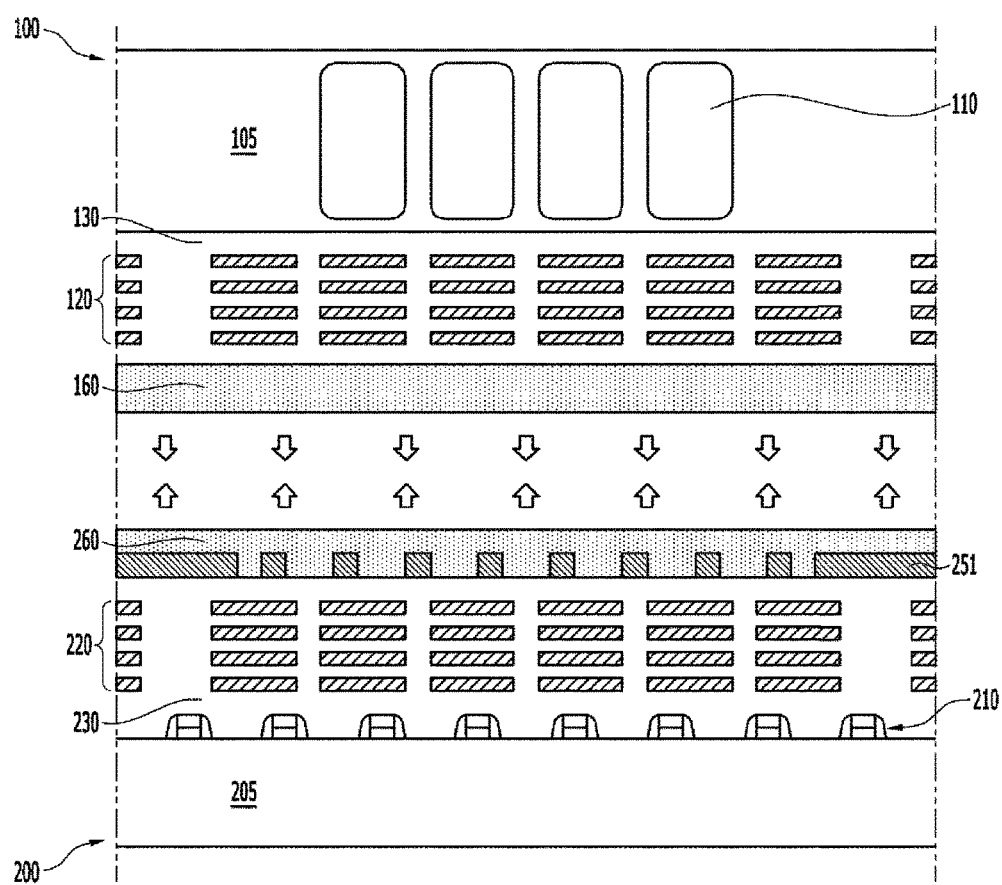
Figure 6B:
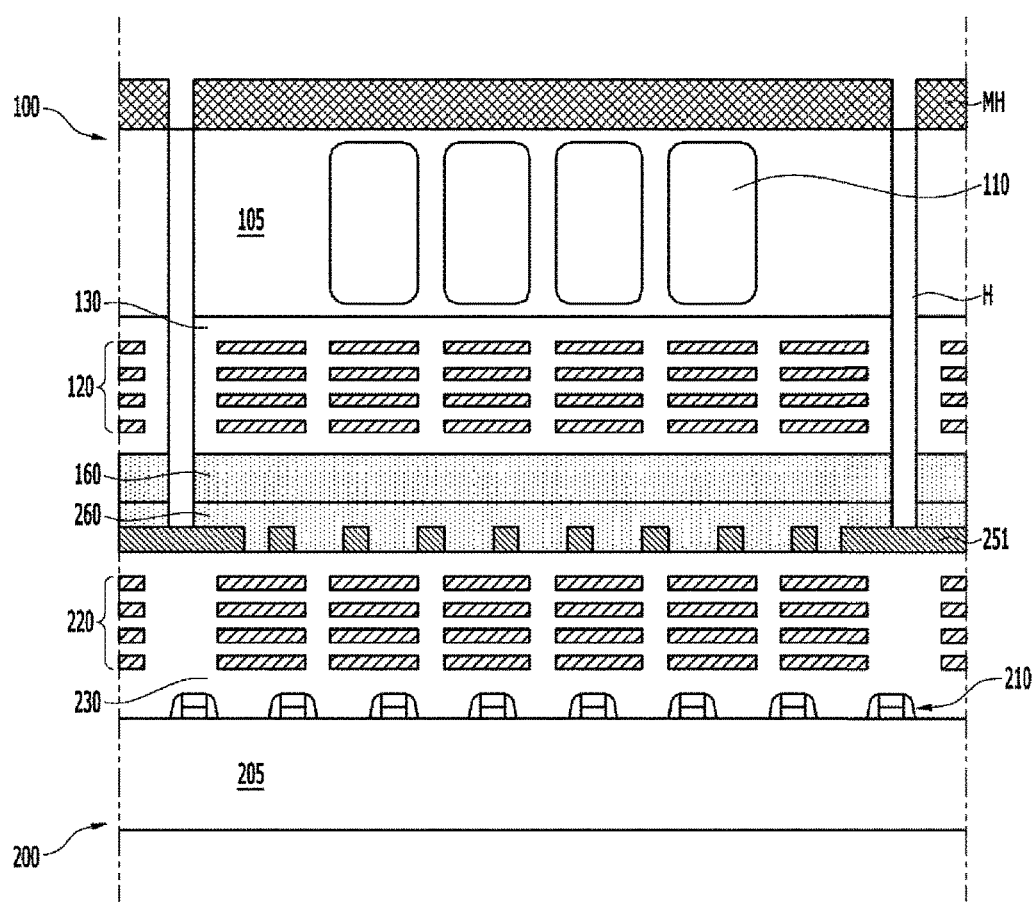
Figure 6C:
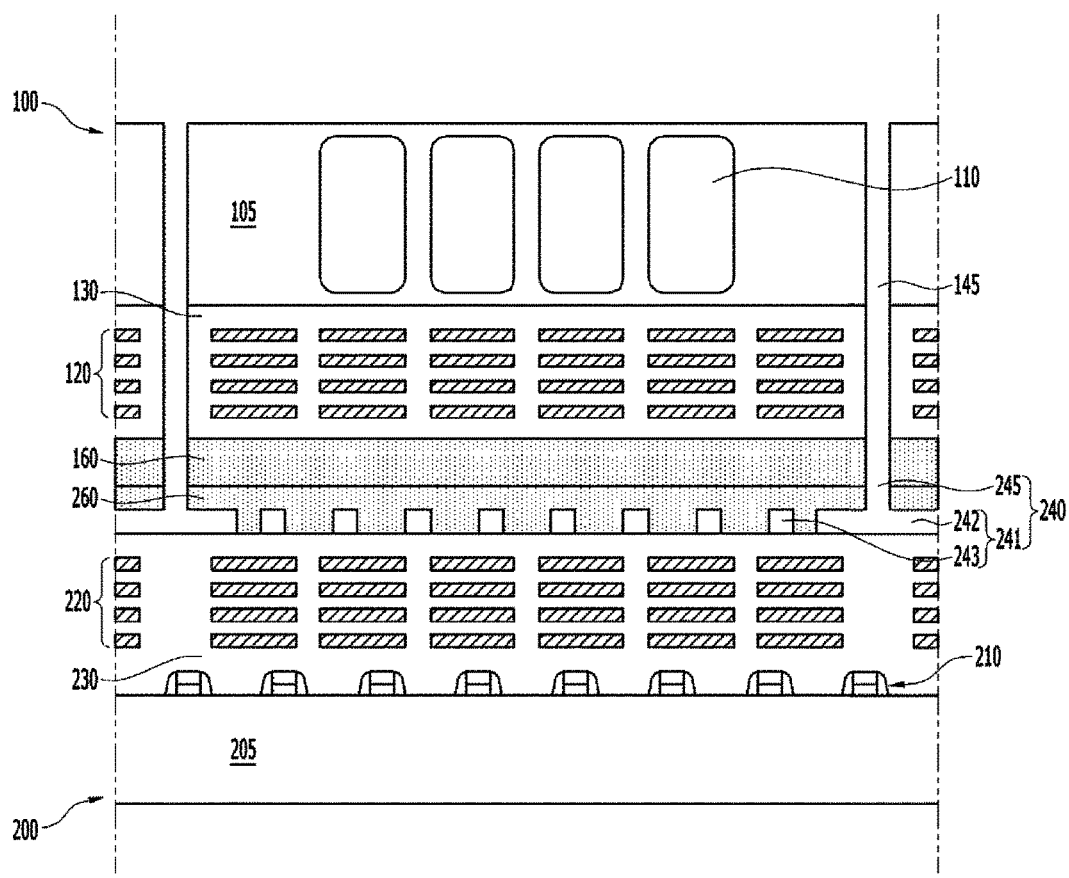

FIGS. 6A to 6C are longitudinal cross-sectional views illustrating a method for fabricating a stacked image sensor in accordance with an embodiment of the inventive concepts.

Referring to FIG. 6A, the method for fabricating a stacked image sensor may include forming a lower device 200, and stacking an upper device 100 over the lower device 200 by performing the processes that are described above with reference to FIGS. 4A to 4C. The forming of the lower device 200 may include forming photodiodes 110 in the inside of the upper substrate 105, and forming upper lines 120, an upper inter-layer dielectric layer 130, and an upper capping layer 160 over the upper substrate 105.

Referring to FIG. 6B, the method may include forming a hole H that penetrates through the upper substrate 105, the upper inter-layer dielectric layer 130, the upper capping layer 160, and the lower capping layer 260 and exposes a lower sacrificial pattern 251 by forming a hole mask pattern MH over the upper device 100 and performing an etch process. Subsequently, the hole mask pattern MH may be removed.

Referring to FIG. 6C, the method may include removing the lower sacrificial pattern 251 through the hole H by performing a wet etch process, and forming an upper vertical air gap 145, a lower vertical air gap 245, and a lower horizontal air gap 241. Through the process, the hole H may be transformed into the upper vertical air gap 145 and the lower vertical air gap 245. Subsequently, the method may include forming a buffer dielectric layer 170 that seals the upper portion of the upper vertical air gap 145 over the upper device 100 by performing a deposition process which is described above by referring to FIG. 4J. The method then may include forming color filters 180 and micro lenses 190 that are aligned with the photodiodes 110 over the buffer dielectric layer 170 by performing a process which is described above by referring to FIG. 2C.

Figure 7:
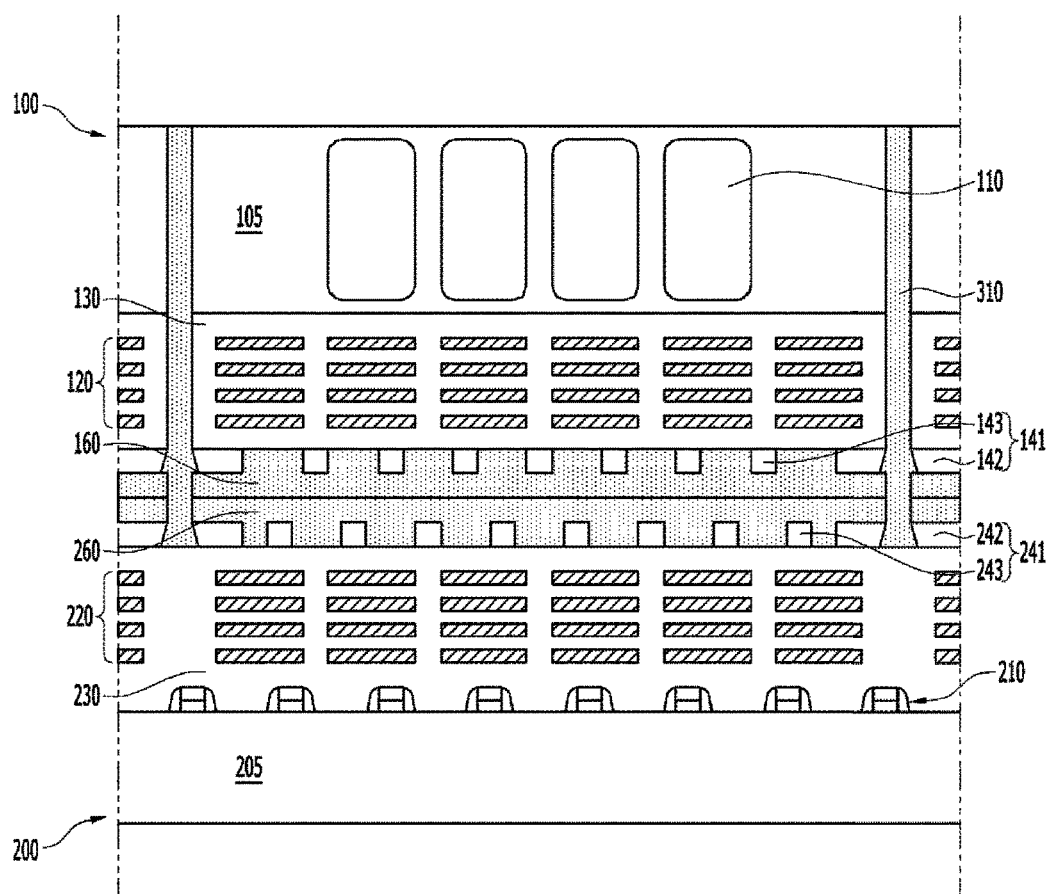

FIG. 7 is a longitudinal cross-sectional view illustrating a method for fabricating a stacked image sensor in accordance with an embodiment of the inventive concepts.

Referring to FIG. 7, the method may include stacking an upper device 100 over a lower device 200 by performing the processes that are described above with reference to FIGS. 4A to 4H, forming an upper air gap 140 and a lower air gap 240, and then forming a gap pillar 310 that fills a hole H, which includes an upper vertical air gap 145 and a lower vertical air gap 245 by performing a deposition process or a gap-fill process. The gap pillar 310 may include a silicon oxide. The gap pillar 310 may have slanted sides in the inside of an outer upper horizontal air gap 142 and an outer lower horizontal air gap 242. Subsequently, the method may include forming a buffer dielectric layer 170, color filters 180, and micro lenses 190 over the upper device 100 by performing a process which is described above by referring to FIG. 2D.

Figure 8:
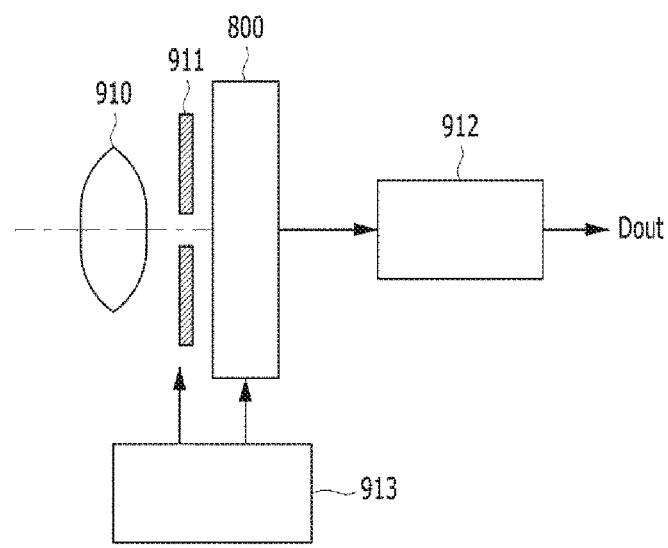
FIG. 8 is a block diagram illustrating an electronic device including at least one image sensor among the stacked image sensors in accordance with the various embodiments of the inventive concepts.

FIG. 8 is a block diagram illustrating an electronic device including at least one image sensor among the stacked image sensors 800A to 800D in accordance with the various embodiments of the inventive concepts.

Referring to FIG. 8, the electronic device including at least one image sensor 800 among the stacked image sensors 800A to 800D in accordance with the various embodiments of the inventive concepts may include a camera capable of taking a still image or a moving picture. The electronic device may include the image sensor 800, an optical system 910 (or an optical lens), a shutter unit 911, a controller 913 for controlling/driving the shutter unit 911, and a signal processor 912.

The optical system 910 may guide optical image from a subject to a pixel array (e.g., "810" of FIG. 1) of the image sensor 800. The optical system 910 may include a plurality of optical lenses. The shutter unit 911 may control the length of time for exposing the image sensor 800 to light and shutting it off. The controller 913 may control a transfer operation of the image sensor 800 and a shutter operation of the shutter unit 911. The signal processor 912 may process diverse kinds of signals outputted from the image sensor 800. Image signals Dout outputted from the signal processor 912 after the signal processing may be stored in a storage medium (not shown), such as a memory, or outputted to a monitor (not shown).

According to an embodiment of the inventive concepts, heat generated in a logic device may be blocked or inhibited from being transmitted to a pixel device and cooled down. Therefore, the stacked image sensor may provide excellent image quality.

Other effects of the various embodiments of the inventive concepts that are not described herein may be understood from the detailed description of the inventive concepts.

While the inventive concepts has been described with respect to the specific embodiments, it will be apparent to those skilled in the art that various changes and modifications may be made without departing from the spirit and scope of the invention as defined in the following claims.

What is claimed is:

1. A stacked image sensor, comprising:
    a lower device including a lower inter-layer dielectric layer over an upper surface of a lower substrate, and a lower capping layer over the lower inter-layer dielectric layer;
    an upper device stacked over the lower device, including photodiodes in an upper substrate, an upper inter-layer dielectric layer below a lower surface of the upper substrate, and an upper capping layer below the upper inter-layer dielectric layer; and
    an air gap formed between the lower inter-layer dielectric layer and the upper inter-layer dielectric layer,
    wherein the air gap includes:
        a lower air gap that is defined by the lower inter-layer dielectric layer and the lower capping layer; and
        an upper air gap that is defined by the upper inter-layer dielectric layer and the upper capping layer,
    wherein the lower air gap and the upper air gap have a mesh shape in a top view.

2. The stacked image sensor of claim 1, wherein the lower air gap includes:
    a lower vertical air gap that is vertically extended by penetrating through the lower capping layer; and
    a lower horizontal air gap that is horizontally extended inside the lower capping layer,
    wherein the lower horizontal air gap is horizontally wider than the lower vertical air gap.

3. The stacked image sensor of claim 2, wherein the lower vertical air gap penetrates through the upper capping layer to be spatially connected to the upper air gap.

4. The stacked image sensor of claim 2, wherein the lower horizontal air gap includes:
    an inner lower horizontal air gap that is vertically aligned with the photodiodes; and
    an outer lower horizontal air gap that is vertically aligned with the lower vertical air gap.

5. The stacked image sensor of claim 1, wherein the upper air gap includes:
    an upper vertical air gap that is vertically extended by penetrating through the upper capping layer; and
    an upper horizontal air gap that is horizontally extended inside the upper capping layer.

6. The stacked image sensor of claim 5, wherein the upper vertical air gap is vertically extended to penetrate through the upper inter-layer dielectric layer and the upper substrate.

7. The stacked image sensor of claim 5, wherein the upper horizontal air gap includes:
    an inner upper horizontal air gap that is vertically aligned with the photodiodes; and
    an outer upper horizontal air gap that is vertically aligned with the upper vertical air gap.

8. The stacked image sensor of claim 6, wherein an upper portion of the upper vertical air gap is open.

9. The stacked image sensor of claim 1,
    wherein the upper horizontal air gap includes:
    an inner upper horizontal air gap that is vertically aligned with the photodiodes; and
    an outer upper horizontal air gap that is vertically aligned with the upper vertical air gap,
    wherein the inner lower horizontal air gap and the inner upper horizontal air gap are arranged alternately in a horizontal direction.

10. The stacked image sensor of claim 1, further comprising:
    a gap pillar that is vertically aligned with the air gap and vertically penetrates through the upper inter-layer dielectric layer and the upper substrate.

11. The stacked image sensor of claim 1, wherein a side of the air gap is open.

12. The stacked image sensor of claim 1, wherein a lower surface of the upper inter-layer insulating layer is exposed to the upper horizontal air gap.

13. A stacked image sensor, comprising:
    a lower device; and
    an upper device stacked over the lower device,
    wherein the lower device includes:
        transistors formed over an upper surface of a lower substrate;
        lower lines over the transistors;
        a lower inter-layer dielectric layer suitable for covering the transistors and the lower lines;
        a lower capping layer that is disposed over the lower inter-layer dielectric layer; and
        a lower air gap that is disposed inside the lower capping layer, and
    wherein the upper device includes:
        photodiodes that are formed inside an upper substrate;
        upper lines that are formed below a lower surface of the upper substrate;
        an upper inter-layer dielectric layer suitable for surrounding the upper lines; and
        an upper capping layer that is disposed below the upper inter-layer dielectric layer,
    wherein the lower air gap includes:
        a lower vertical air gap that is vertically extended by penetrating through the lower capping layer and the upper capping layer; and
        a lower horizontal air gap that is horizontally extended inside the lower capping layer,
    wherein the lower horizontal air gap is horizontally wider than the lower vertical air gap, and wherein an upper surface of the lower inter-layer insulating layer is exposed to the lower horizontal air gap.

14. The stacked image sensor of claim 13, wherein the upper device further includes:
an upper air gap that is defined by the upper inter-layer dielectric layer and the upper capping layer, and
wherein the upper air gap includes:
an upper vertical air gap that penetrates through the upper inter-layer dielectric layer and the upper substrate and is vertically aligned with the lower vertical air gap; and
an upper horizontal air gap that is horizontally extended inside the upper capping layer,
wherein a lower surface of the upper inter-layer insulating layer is exposed to the upper horizontal air gap.

15. The stacked image sensor of claim 14, wherein the lower horizontal air gap and the upper horizontal air gap include:
an inner lower horizontal air gap and an inner upper horizontal air gap that are vertically aligned with a region where the photodiodes are formed; and
an outer lower horizontal air gap and an outer upper horizontal air gap that are vertically aligned with the lower vertical air gap and the upper vertical air gap, respectively.

16. The stacked image sensor of claim 13, wherein a surface of the lower capping layer is exposed to the lower horizontal air gap.

17. A stacked image sensor, comprising:
a lower device; and
an upper device stacked over the lower device,
wherein the lower device includes:
transistors formed over an upper surface of a lower substrate;
a lower inter-layer dielectric layer suitable for covering the transistors; and
a lower capping layer that is disposed over the lower inter-layer dielectric layer, and
wherein the upper device includes:
photodiodes that are formed inside an upper substrate;
an upper inter-layer dielectric layer that is disposed below a lower surface of the upper substrate;
an upper capping layer that is disposed below the upper inter-layer dielectric layer; and
an upper air gap inside the upper capping layer,
wherein the upper air gap includes:
an upper vertical air gap that is vertically extended by penetrating through the upper inter-layer dielectric layer and the upper substrate; and
an upper horizontal air gap that is horizontally extended inside the upper capping layer,
wherein the upper horizontal air gap is horizontally wider than the upper vertical air gap, and
wherein a lower surface of the upper inter-layer insulating layer is exposed to the upper horizontal air gap.

18. The stacked image sensor of claim 17, wherein the lower device further includes:
a lower air gap that is defined by the lower inter-layer dielectric layer and the lower capping layer, and
wherein the lower air gap includes:
a lower vertical air gap that vertically penetrates through the lower capping layer and the upper capping layer and is vertically aligned with the upper vertical air gap; and
a lower horizontal air gap that is horizontally extended inside the lower capping layer,
wherein an upper surface of the lower inter-layer insulating layer is exposed to the lower horizontal air gap.

19. The stacked image sensor of claim 17, wherein a surface of the upper capping layer is exposed to the upper horizontal air gap.

* * * * *